(12) United States Patent
Morimoto

(10) Patent No.: US 7,868,969 B2
(45) Date of Patent: Jan. 11, 2011

(54) AREA LIGHT SOURCE APPARATUS AND LIQUID CRYSTAL DISPLAY APPARATUS ASSEMBLY

(75) Inventor: Tadashi Morimoto, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/703,250

(22) Filed: Feb. 10, 2010

(65) Prior Publication Data

US 2010/0133559 A1 Jun. 3, 2010

Related U.S. Application Data

(62) Division of application No. 11/936,420, filed on Nov. 7, 2007.

(30) Foreign Application Priority Data

Nov. 9, 2006 (JP) ............................. 2006-303788

(51) Int. Cl.
*G02F 1/1335* (2006.01)
(52) U.S. Cl. .............................. 349/61; 349/62; 349/64; 349/69; 349/95; 362/97.1; 362/97.2; 362/97.3
(58) Field of Classification Search .................... 349/61
See application file for complete search history.

(56) References Cited

U.S. PATENT DOCUMENTS

| | | | | | |
|---|---|---|---|---|---|
| 6,633,351 | B2 * | 10/2003 | Hira et al. | ...................... | 349/95 |
| 6,897,911 | B2 * | 5/2005 | Yamaguchi | .................. | 349/57 |
| 2002/0149943 | A1 * | 10/2002 | Obata | .......................... | 362/339 |
| 2006/0221592 | A1 * | 10/2006 | Nada et al. | ..................... | 362/29 |

FOREIGN PATENT DOCUMENTS

JP 2005-258403 9/2005

\* cited by examiner

*Primary Examiner*—David Nelms
*Assistant Examiner*—Mary A El Shammaa
(74) *Attorney, Agent, or Firm*—SNR Denton US LLP

(57) ABSTRACT

Disclosed herein is an area light source apparatus for illuminating a liquid crystal display apparatus of the transmission type, which has a display area formed from a plurality of pixels arrayed in a two-dimensional matrix, from the back, including: a plurality of light emitting element assemblies each provided as a light source and each including a light emitting element and a lens through which light emitted from the light emitting element passes; and a plurality of dummy lenses disposed in the proximity of each of the light emitting element assemblies and configured same as the lenses of the light emitting element assemblies.

1 Claim, 11 Drawing Sheets

VALUE OBTAINED BY RAISING THE CONTROL
SIGNAL VALUE TO THE 2.2TH POWER
$(x' \equiv x^{2.2})$

VALUE (X) OF CONTROL SIGNAL

AREA LIGHT SOURCE APPARATUS AND LIQUID CRYSTAL DISPLAY APPARATUS ASSEMBLY

RELATED APPLICATION DATA

This application is a division of U.S. patent application Ser. No. 11/936,420, filed Nov. 7, 2007, the entirety of which is incorporated herein by reference to the extent permitted by law. The present application claims the benefit of priority to Japanese Patent Application No. JP 2006-303788 filed with the Japan Patent Office on Nov. 9, 2006, the entirety of which is incorporated by reference herein to the extent permitted by law.

BACKGROUND OF THE INVENTION

1. Field of the Invention

This invention relates to an area light source apparatus called backlight which illuminates a liquid crystal display apparatus of the transmission type, which has a display area formed from pixels disposed in a two-dimensional matrix, from the back and a liquid crystal display apparatus assembly which incorporates the area light source apparatus.

2. Description of the Related Art

The liquid crystal material itself in a liquid crystal display apparatus does not emit light. Accordingly, for example, a direct area light source apparatus (backlight) for illuminating the display area of the liquid crystal display apparatus is disposed rearwardly of the display area which is formed from a plurality of pixels. It is to be noted that, in a color liquid crystal display apparatus, one pixel is composed of three sub pixels including a red light emitting sub pixel, a green light emitting sub pixel and a blue light emitting sub pixel. A liquid crystal cell which composes each pixel or each sub pixel is controlled so as to operate as a kind of an optical shutter (light valve) to control the light transmittance (numerical aperture) of the pixel or the sub pixel thereby to control the light transmittance for the illumination light (for example, white light) emitted from the area light source apparatus to display an image.

In the past, an area light source apparatus in a liquid crystal display apparatus assembly illuminates the entire display area with a uniform and fixed brightness. However, an area light source apparatus having a configuration different from that of such an area light source apparatus as described above, that is, an area light source apparatus including a plurality of area light source units and having a configuration for varying the distribution of the luminous intensity over the display area units, is in the past known as an area light source apparatus of the partial driving type or the divisional driving type and disclosed, for example, in Japanese Patent Laid-Open No. 2005-258403. Control of such an area light source apparatus as just described is called partial driving or divisional driving of an area light source apparatus. By such partial driving or divisional driving, increase of the contrast ratio by increase of the white level in the liquid crystal display apparatus and drop of the black level can be achieved. As a result, enhancement of the quality of image display can be achieved and reduction of the power consumption of the area light source apparatus can be anticipated.

A light emitting diode (LED) assembly is frequently used as a light source which composes an area light source apparatus. The light emitting diode assembly includes a plurality of light emitting diodes, and a plurality of lenses through which light emitted from the light emitting diodes passes. The light passing through each lens has a radiation angle characteristic (for example, a Lambertian distribution) based on the characteristic of the lenses. Then, the red light emitting diodes, green light emitting diodes and blue light emitting diodes are energized to emit red light, green light and blue light, respectively. The red light, green light and blue light are mixed to produce white light, with which the display area of the liquid crystal display apparatus is illuminated. It is to be noted that the area light source apparatus includes a plurality of light emitting diode assembly groups each including red light emitting diode assembles, green light emitting diode assemblies and blue light emitting diode assemblies. The number of red light emitting diode assemblies, the number of green light emitting diode assemblies and the number of blue light emitting diode assemblies in one light emitting diode assembly group and the array pattern of the light emitting diode assemblies are normally determined based on specifications of the area light source apparatus. In order to prevent occurrence of color unevenness or luminance unevenness, the light emitting diode assemblies are frequently gathered in a narrow region.

SUMMARY OF THE INVENTION

Where red light emitting diodes, green light emitting diodes and blue light emitting diodes in light emitting diode assembly groups are energized to emit light and the resulting red light, green light and blue light are mixed to produce white light as described above, the light emitting diodes are disposed in the following manner. In particular, a red light emitting diode assembly (R), a green light emitting diode assembly (G) and a blue light emitting diode assembly (B) which form a light emitting diode assembly group are disposed in such a manner as seen in a schematic view of FIG. 11A in which they are viewed from above. Meanwhile, the green light emitting diode assembly (G) and the blue light emitting diode assembly (B) are disposed as seen in FIG. 11B in which they are viewed from sidewardly. It is to be noted that one light emitting diode assembly group is composed of one red light emitting diode assembly (R), one green light emitting diode assembly (G) and one blue light emitting diode assembly (B). Further, the light emitting diode assemblies (R), (G) and (B) are positioned at the vertices of an imaginary equilateral triangle.

In such light emitting diode assemblies (R), (G) and (B), light emitted from a certain one of the light emitting diode assemblies (R), (G) and (B) enters and is refracted by a lens which forms the other ones of the light emitting diode assemblies (R), (G) and (B) and then emerges from the lens. Accordingly, the radiation of light emitted from the light emitting diode assemblies (R), (G) and (B) becomes asymmetrical with respect to the axes of the light emitting diode assemblies (R), (G) and (B). As a result, in a space above the light emitting diode assembly groups, a region within which the mixture state of the red light, green light and blue light is non-uniform increases, which gives rise to a problem that color unevenness or luminance unevenness occurs in the space. Particularly where one area light source unit is energized to emit light in an area light source apparatus of the partial driving type, since the influence from the other area light source units disappears, color unevenness or luminance unevenness is likely to stand out.

Accordingly, it is demanded to provide an area light source by which occurrence of a problem that radiation of light emitted from a light emitting element assembly becomes asymmetrical with respect to the axis of the light emitting element assembly and this gives rise to occurrence of color unevenness or luminance unevenness can be prevented with certainty and a liquid crystal display apparatus assembly which incorporates the area light source apparatus.

According to an embodiment of the present invention, there is provided an area light source apparatus for illuminating a liquid crystal display apparatus of the transmission type, which has a display area formed from a plurality of pixels arrayed in a two-dimensional matrix, from the back, including a plurality of light emitting element assemblies each provided as a light source and each including a light emitting element and a lens through which light emitted from the light emitting element passes, and a plurality of dummy lenses disposed in the proximity of each of the light emitting element assemblies and configured same as the lenses of the light emitting element assemblies.

According to another embodiment of the present invention, there is provided a liquid crystal display apparatus assembly including a liquid crystal display apparatus of the transmission type having a display area formed from a plurality of pixels disposed in a two-dimensional matrix, and an area light source apparatus for illuminating the liquid crystal display apparatus from the back, the area light source apparatus including a plurality of light emitting element assemblies each provided as a light source and each including a light emitting element and a lens through which light emitted from the light emitting element passes, the area light source apparatus including a plurality of dummy lenses which are disposed in the proximity of the light source element assemblies and are same as the lenses included in the light emitting element assemblies.

In the area light source apparatus and the liquid crystal display apparatus assembly, while each of the dummy lenses may be formed from a lens as a separate item, it may otherwise be formed from an inoperative light emitting element assembly which has a configuration and structure same as those of the light emitting element assemblies but is not operated to emit light. Such an inoperative light emitting element assembly is hereinafter referred to as dummy light emitting element assembly. It is to be noted that, where the dummy lens is formed from a lens as a separate item, preferably the dummy lens and the lens which composes the light emitting element assembly are same lenses which are same as each other in terms of the material, shape and so forth. On the other hand, where the dummy lens is formed from a dummy light emitting element assembly, preferably the light emitting element assembly and the dummy light emitting element assembly are same as each other.

In the area light source apparatus and the liquid crystal display apparatus assembly which may additionally have the preferred configuration described above, preferably each of the dummy lenses is disposed in a region in which light emitted from the lenses which compose the light emitting element assemblies is introduced directly into the dummy lens.

Further, in the area light source apparatus and the liquid crystal display apparatus assembly which may additionally have any of the preferred configurations described above, preferably, in the proximity of any of the light emitting element assemblies, other ones of the light emitting element assemblies are disposed. In this instance, preferably one of the light emitting element assemblies is disposed in a region in which light emitted from the lens of another one of the light emitting element assemblies is introduced directly into the light emitting element assembly. Further, in this instance, preferably a light emitting element assembly group is composed of a plurality of ones of the light emitting element assemblies which are positioned at the vertices of one or a plurality of imaginary regular triangles, and a plurality of ones of the dummy lenses are disposed on the outer side of the light emitting element assembly group in such a manner as to be positioned at the vertices of imaginary regular triangles of the same shape as that of the imaginary regular triangle. Or, a light emitting element assembly group may be composed of a plurality of ones of the light emitting element assemblies which are positioned at the vertices of one or a plurality of imaginary squares, and a plurality of ones of the dummy lenses may be disposed on the outer side of the light emitting element assembly group in such a manner as to be positioned at the vertices of imaginary squares of the same shape as that of the imaginary square.

For example, the area light source apparatus and the liquid crystal display apparatus assembly may have such a form that each light emitting element assembly group is composed of three light emitting element assemblies which are positioned at the vertices of one imaginary regular triangle, and nine dummy lenses are disposed in such a manner as to be positioned at the vertices of an imaginary regular triangle of the same shape as that of the imaginary regular triangle. Or, the area light source apparatus and the liquid crystal display apparatus assembly may have such a form that a light emitting element assembly group is composed of four light emitting element assemblies which are positioned at the vertices of one imaginary square, and twelve dummy lenses are disposed in such a manner as to be positioned at the vertices of an imaginary square of the same shape as that of the imaginary square. Or else, the area light source apparatus and the liquid crystal display apparatus assembly may have such a form that a light emitting element assembly group is composed of five light emitting element assemblies which are positioned at the vertices of two imaginary regular triangles, and fourteen dummy lenses are disposed in such a manner as to be positioned at the vertices of imaginary regular triangles of the same shape as that of the imaginary regular triangles.

Or otherwise, dummy lenses may be disposed in rotational symmetry, in point symmetry or in line symmetry with respect to an axis of the light emitting element assembly. In particular, the rotational symmetry may be, for example, four-fold rotational symmetry, six-fold rotational symmetry or eight-fold rotational symmetry with respect to the axis of the light emitting element assembly. It is to be noted that, where the dummy lenses are disposed in rotational symmetry, in point symmetry or in line symmetry, if they overlap with some light emitting element assemblies, then light emitting element assemblies should be disposed in the regions.

In the area light source apparatus and the liquid crystal display apparatus assembly which may additionally have the preferred configuration described above, a plurality of ones of the light sources may be driven simultaneously in the same driving condition. Or, a plurality of ones of the light sources may be driven partially. In particular, the area light source apparatus may be configured such that, where it is assumed that the display area of the liquid crystal display apparatus is divided into P×Q imaginary display area units, the area light source apparatus includes P×Q area light source units corresponding to the P×Q display area units, the light emitting state of the P×Q area light source units being controlled individually, each of the area light source units including a light source formed from a plurality of ones of the light emitting element assemblies.

A partition wall may be disposed between adjacent ones of the area light source units. The partition walls may be formed from a material which is opaque with respect to light emitted from the light sources provided in the area light source units such as an acrylic resin, a polycarbonate resin or an ABS resin. Or the partition walls may be formed from a material transparent with respect to light emitted from the light sources provided in the area light source units such as poly methyl methacrylate (PMMA), a polycarbonate resin (PC), a polyallylate resin (PAR), a polyethylene terephthalate resin (PET) or glass. The surface of the partition walls may have a light diffusion reflection function or may have a mirror reflection function. In order to provide the surface of the partition walls with a light diffusion reflection function, sand blasting may be applied to form concaves and convexes on the surface of the partition walls or a film having concaves and convexes thereon may be adhered to the surface of the partition walls. On the other hand, in order to provide the surface of the partition walls with a mirror reflection function, a light reflecting film may be adhered to the surface of the partition walls or a light reflecting layer may be formed on the surface of the partition walls, for example, by plating.

In the area light source apparatus and the liquid crystal display apparatus assembly which may additionally have the preferred configuration described above (such apparatus and assembly may be hereinafter referred to collectively as present invention), designing or determination of specifications of the lenses and the dummy lenses may be performed finally based on an emerging solid angle or a luminance profile of light emitted from each light emitting element assembly, the size of the liquid crystal display apparatus (or display area unit) to be illuminated with light emitted from the light emitting element assembly, a luminance profile necessary for the liquid crystal display apparatus (or display area unit) and so forth. For example, it is possible to obtain a light emitting element assembly which includes a lens or a dummy lens whose light intensity has an isotropic distribution like the Lambertian distribution. Also it is possible to obtain a light emitting element assembly which includes a lens or a dummy lens having a two-dimensional directional emission configuration by which light is emitted principally in horizontal directions. The lens and the dummy lens may be formed from optical glass or a plastic material. Here, the plastic material used to form a plastic lens may be a thermoplastic resin such as an acrylic resin, a polycarbonate resin, a PMMA resin, a polyolefin resin, a polyester resin, a polyurethane resin, polysulfone resin, polystyrene resin, a vinyl resin or a halogen type resin or a thermosetting resin such as an epoxy resin, a polyimide resin, a urea resin, a phenol resin or a silicone resin. A plastic resin can be molded, for example, by injection molding although it depends upon the material. The lens may be fixed by a suitable method in such a manner as to cover the light emitting element, or the lens and the light emitting element may be formed integrally with each other. In the latter case, the lens may be formed semi-spherically (or in a dome shape) using, for example, a potting resin, or may be formed using lithography and etching in combination.

In the present invention, a light emitting diode (LED) may be used for the light emitting element. Where a light emitting diode is used as the light source, a red light emitting diode which emits light of a red color typically of the wavelength of 640 nm, a green light emitting diode which emits light of a green color typically of the wavelength of 530 nm and blue light emitting diode which emits light of a blue color typically of the wavelength of 450 nm may be used as a group to obtain white light. As occasion demands, an additional light emitting diode or diodes which emit light of a fourth color, a fifth color and so forth other than the red, green and blue colors may be provided. A light source composed of light emitting diodes is preferable in that the occupation area thereof is small.

More particularly, as a combination of light emitting element assemblies which compose a light source, a combination of (one red light emitting element assembly, one green light emitting element assembly and one blue light emitting element assembly), another combination of (one red light emitting element assembly, two green light emitting element assemblies and one blue light emitting element assembly), a further combination of (two red light emitting element assemblies, two green light emitting element assemblies and one blue light emitting element assembly) or the like may be used.

A light emitting diode used to form a light source may have a face-up structure or a flip chip structure. In particular, a light emitting diode is formed from a substrate and a light emitting layer formed on the substrate and may have a structure wherein light is emitted to the outside from the light emitting layer or another structure wherein light from the light emitting layer is emitted to the outside through the substrate. More particularly, a light emitting diode (LED) has a layered structure, for example, of a first compound semiconductor layer formed on the substrate and having a first conduction type such as, for example, the n type, an active layer formed on the first compound semiconductor layer, and a second compound semiconductor layer formed on the active layer and having a second conduction type such as, for example, the p type. The light emitting diode further includes a first electrode electrically connected to the first compound semiconductor layer and a second electrode electrically connected to the second compound semiconductor layer. The layers of the light emitting diode may be formed from known compound semiconductor materials depending upon the wavelength of light to be emitted.

The light emitting diode may be structured such that it further includes a bullet-shaped or dome-shaped cap provided at a portion through which light from the light emitting layer is emitted to the outside. Incidentally, if an air layer exists between the light emitting layer and the cap, then a phenomenon that light emitted from the light emitting layer does not enter the cap immediately but is totally reflected by the inner face of the cap sometimes occurs. If such a phenomenon as just described occurs, then such a problem occurs that, since the totally reflected light is absorbed back into the light emitting layer, the light extraction efficiency drops. Accordingly, preferably a filler is filled in the gap between the light emitting layer and the cap. The filler may be formed from a gel-like material, a fluorene acrylic resin, silicone rubber or a silicone oil compound and preferably has a refractive index of 1.40 or more. More particularly, as the gel-like material, for example, OCK-451 (refractive index: 1.51) or OCK-433 (refractive index: 1.46) by Nye can be used, or an oil compound material such as silicone rubber or a silicone oil compound such as, for example, TSK5353 (refractive index: 1.45) by Toshiba Silicone can be used. It is to be noted that, if the bullet-shaped or dome-shaped cap and the filler function as a lens and there is no necessity to provide a lens separately, then the cap can be regarded as a lens.

The area light source apparatus includes a light diffusion plate and may further include an optical function sheet group such as a diffusion sheet, a prism sheet and a polarization conversion plate and/or a reflecting sheet. The optical function sheet group may be formed from various sheets disposed in a spaced relationship from each other or may be formed as a layered integral sheet of various layers. The light diffusion plate and the optical function sheet group are disposed between the area light source apparatus and the liquid crystal display apparatus.

The liquid crystal display apparatus of the transmission type includes, for example, a front panel having a transparent first electrode, a rear panel having a transparent second electrode, and a liquid crystal material disposed between the front panel and the rear panel. It is to be noted that the liquid crystal display apparatus may be a monochromatic liquid crystal display apparatus or a color liquid crystal display apparatus.

The front panel includes a first substrate formed, for example, from a glass substrate or a silicon substrate, a transparent first electrode (also called common electrode and made of, for example, ITO) provided on the inner face of the first substrate, and a polarizing film provided on the outer face of the first substrate. Further, where the color liquid crystal display apparatus is of the transmission type, color filters coated with an overcoat layer made of an acrylic resin or an epoxy resin are provided on the inner face of the first substrate. For the arrangement pattern of the color filters, a delta array, a stripe array, a diagonal array or a rectangular array may be used. The front panel is further configured such that the transparent first electrode is formed on the overcoat layer. It is to be noted that an orientation film is formed on the transparent first electrode. Meanwhile, the rear panel includes a second substrate formed, for example, from a glass substrate or a silicon substrate, switching elements formed on the inner face of the second substrate, transparent second electrodes also called pixel electrodes and made of, for example, ITO for being controlled by the switching elements between conducting and non-conducting states, and a polarizing film provided on the outer face of the second substrate. An orientation film is formed over the overall area including the transparent second electrodes. The members and the liquid crystal material of the liquid crystal display apparatus including the color liquid crystal display apparatus of the transmission type may be formed from known members and materials. The switching elements may be three-terminal elements such as MOS FETs or thin film transistors (TFTs) formed on a single crystal silicon semiconductor substrate or two-terminal elements such as MIM elements, varistor elements or diodes.

A region in which the transparent first electrode and a second transparent electrode overlap with each other and which includes a liquid crystal cell corresponds to one pixel or one sub pixel. In a color liquid crystal display apparatus of the transmission type, a red light emitting sub pixel (sometimes referred to as sub pixel [R]) which compose each pixel is formed from a combination of a liquid crystal cell which forms such a region as described above and a color filter which transmits red light therethrough. A green light emitting sub pixel (sometimes referred to as sub pixel [G]) is formed from a combination of a liquid crystal cell which forms the region and a color filter which transmits green light therethrough. A blue light emitting sub pixel (sometimes referred to as sub pixel [B]) is formed from a combination of a liquid crystal cell which forms the region and a color filter which transmits blue light therethrough. The arrangement pattern of the sub pixel [R], sub pixel [G] and sub pixel [B] coincides with the arrangement pattern of the color filters described hereinabove. It is to be noted that one pixel is not limited to that which is composed of a set of three different pixels [R, G, B] including the sub pixel [R], sub pixel [G] and sub pixel [B], but may include, for example, in addition to the three different sub pixels [R, G, B], one or a plurality of different sub pixels. For example, one pixel may include, in addition to the three different sub pixels [R, G, B], a sub pixel which emits white light in order to raise the luminance, sub pixels which emit light of complementary colors in order to expand the color reproduction range, or sub pixels which emit light of yellow and cyan in order to expand the color reproduction range.

Here, the light transmittance (also called numerical aperture) Lt of a pixel or a sub pixel, the luminance (surface luminance) y of a portion of the display region corresponding to the pixel or sub pixel and the luminance (light source luminance) Y of an area light source unit are defined in the following manner.

$Y_1$: for example, highest luminance of the light source luminance. This luminance is hereinafter referred to sometimes as light source luminance first prescribed value.

$Lt_1$: for example, maximum value of the light transmittance (numerical aperture) of a pixel or a sub pixel of a display area unit. The value described is hereinafter referred to sometimes as light transmittance first prescribed value.

$Lt_2$: light transmittance (numerical aperture) of a pixel or a sub pixel when it is assumed that a control signal corresponding to an input signal, which is inputted to a driving circuit for driving all pixels, which compose the display area unit, having a value equal to a display area unit input signal maximum value $x_{U\text{-}max}$ which is a maximum value among values of the input signal, is supplied to the pixel or sub pixel. The light transmittance described is hereinafter referred to sometimes as light transmittance second prescribed value. It is to be noted that the light transmittances $Lt_1$ and $Lt_2$ satisfy a relationship of $0 \leq Lt_1 \leq Lt_2$.

$y_2$: display luminance obtained when it is assumed that the light source luminance is the light source luminance first prescribed value $Y_1$ and the light transmittance (numerical aperture) of a pixel or a sub pixel is the light transmittance second prescribed value $Lt_2$. The display luminance described is hereinafter referred to sometimes as display luminance second prescribed value.

$Y_2$: light source luminance of an area light source unit for setting the luminance of a pixel or a sub pixel to the display second prescribed value $y_2$ when it is assumed that a control signal corresponding to an input signal having a value equal to the display area unit input signal maximum value $x_{U\text{-}max}$ is supplied to the pixel or sub pixel and besides it is assumed that the light transmittance (numerical aperture) of the pixel or sub pixel at this time is corrected to the light transmittance first prescribe value $Lt_1$. It is to be noted that the light source luminance $Y_2$ is sometimes subjected to correction in which the influence of the light source luminance of each area light source unit on the light source luminance of any other area light source unit is taken into consideration.

Upon partial driving of the area light source apparatus, the luminance of a light source which composes an area light source unit corresponding to each display area unit is controlled by a driving circuit so that the luminance of a pixel when it is assumed that a control signal corresponding to an input signal having a value equal to the display area unit input signal maximum value $x_{U\text{-}max}$ may be supplied to the pixel, that is, the display luminance second prescribed value $y_2$ at the light transmittance first prescribed value $Lt_1$ may be obtained. Particularly, the light source luminance $Y_2$ may be controlled, for example, decreased, so that, for example, the display luminance $y_2$ may be obtained when the light transmittance (numerical aperture) of a pixel or a sub pixel is set, for example, to the light transmittance first prescribed value $Lt_1$. In other words, the light source luminance $Y_2$ of an area light source unit may be controlled for each image display frame so that, for example, the following expression (1) may be satisfied:

$$Y_2 \cdot Lt_1 = Y_1 \cdot Lt_2 \tag{1}$$

Where the number $M_0 \times N_0$ of the pixels arranged in a two-dimensional matrix is represented by $(M_0, N_0)$, several image display resolutions are available including VGA (640, 480), S-VGA (800, 600), XGA (1,024, 768), APRC (1,152, 900), S-XGA (1,280, 1,024), U-XGA (1,600, 1,200), HD-TV (1,920, 1,080), and Q-XGA (2,048, 1,536) as well as (1,920, 1,035), (720, 480) and (1,280, 960). However, the number of pixels is not limited to any of them. Further, the value of ($M_0$, $N_{10}$) and the value of (P, Q) may have any of relationships illustrated in Table 1 below although the relationship between them is not limited to any of them. As the number of pixels which compose one display area unit, 20×20 to 320×240, preferably 50×50 to 200×200, may be adopted. The number of pixels may be fixed or may be different among different display area units.

TABLE 1

|  | Value of P | Value of Q |
|---|---|---|
| VGA (640, 480) | 2~32 | 2~24 |
| S-VGA (800, 600) | 3~40 | 2~30 |
| XGA (1024, 768) | 4~50 | 3~39 |
| APRC (1152, 900) | 4~58 | 3~45 |
| S-XGA (1280, 1024) | 4~64 | 4~51 |
| U-XGA (1600, 1200) | 6~80 | 4~60 |
| HD-TV (1920, 1080) | 6~86 | 4~54 |
| Q-XGA (2048, 1536) | 7~102 | 5~77 |
| (1920, 1035) | 7~64 | 4~52 |
| (720, 480) | 3~34 | 2~24 |
| (1280, 960) | 4~64 | 3~48 |

The driving circuit for driving the liquid crystal display apparatus and the area light source apparatus includes, for example, a light emitting diode (LED) driving circuit, an area light source apparatus driving circuit and an area light source unit driving circuit each of which is formed from an arithmetic operation circuit, a storage device (memory) and so forth, and a liquid crystal display apparatus driving circuit formed from a known circuit such as a timing controller. Control of the luminance (display luminance) of a portion of the display area and the luminance (light source luminance) of the area light source unit is performed for each one image display frame. It is to be noted that the number of images of image information sent for one second as an electric signal to the driving circuit is a frame frequency (frame rate), and the reciprocal number to the frame frequency is frame time (unit: second).

Thus, in the present invention, in the proximity of each light emitting assembly, dummy lenses same as a lens which forms the light emitting element assembly are disposed. Accordingly, such a situation that, when light emitted from a certain light emitting element assembly enters a lens which composes another light emitting element assembly and then emerges from the lens, radiation of the light emitted from the certain light emitting element assembly becomes asymmetrical with respect to an axis of the light emitting element assembly can be prevented. As a result, occurrence of such a problem that, in a space positioned above the light emitting diode assembly group, a region within which the mixture state of red light, green light and blue light is non-uniform increases can be suppressed with certainty.

Further, where the partial driving method (divisional driving method) is adopted in the present invention, since the luminance distribution when one of the display area units is energized to emit light is uniformized, design for improvement in performance (increase in contrast, reduction in power consumption and so forth) is facilitated. Furthermore, also the luminance distribution when a plurality of display area units are energized to emit light at the same time is uniformized.

Further, in the present invention, if the partial driving method (divisional driving method) is adopted and the luminance of a light source which composes an area light source unit corresponding to each display area unit is controlled by the driving circuit so that the luminance of a pixel when it is assumed that a control signal corresponding to an input signal having a value equal to the display area unit input signal maximum value $x_{U\text{-}max}$ is supplied to the pixel may be obtained, that is, the display second prescribed value $y_2$ at the light transmittance first prescribe value $Lt_1$ may be obtained, then reduction of the power consumption of the area light source apparatus can be achieved. Besides, increase of the white level and reduction of the black level can be achieved. Consequently, a high contrast ratio which is a ratio in luminance between a full black display portion and a full white display portion which do not include external light reflection and so forth on the screen surface of the liquid crystal display apparatus can be achieved, and the brightness of a desired display area can be emphasized. Therefore, improvement in the quality of image display can be anticipated.

The above and other objects, features and advantages of the present invention will become apparent from the following description and the appended claims, taken in conjunction with the accompanying drawings in which like parts or elements denoted by like reference symbols.

DETAILED DESCRIPTION OF THE PREFERRED EMBODIMENTS

Before preferred embodiments of the present invention are described, an outline of a liquid crystal display apparatus of the transmission type suitable for use with the embodiments, particularly, a color liquid crystal display apparatus of the transmission type, and an area light source apparatus is described with reference to FIGS. 4, 5, 6A, 6B and 7.

It is to be noted that the area light source apparatus described above includes P×Q area light source units corresponding to P×Q imaginary display area units into which the display area of a liquid crystal display apparatus is assumed to be divided. The light emitting state of the P×Q area light source units is controlled individually, and a light source provided for each area light source unit is formed from a plurality of light emitting element assemblies. Therefore, the area light source apparatus is formed as an area light source apparatus of the partial driving type or divisional driving type. However, the area light source apparatus is not limited to that of the type just described, but may be of another type wherein a plurality of light sources are driven simultaneously in a same driving condition.

Figure 4:
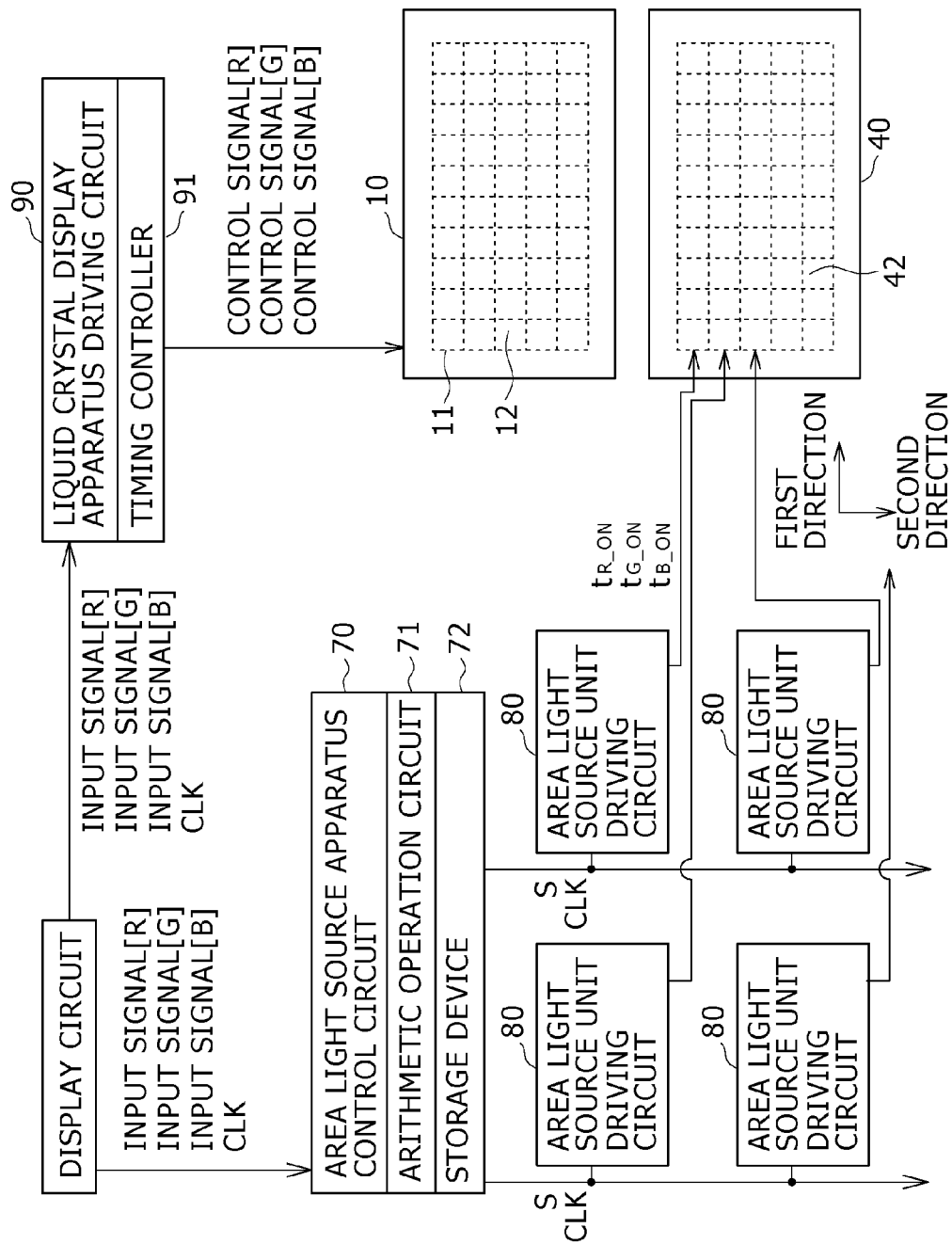
FIG. 4 is a block diagram illustrating a concept of a liquid crystal display apparatus assembly composed of a color liquid crystal display apparatus and an area light source apparatus suitable for use with the embodiments of the present invention.

Referring to FIG. 4, the color liquid crystal display apparatus 10 of the transmission type includes a display area 11 in which totaling $M_0 \times N_0$ pixels are arranged in a two-dimensional matrix such that $M_0$ pixels are arranged along a first direction and $N_0$ pixels are arranged in a second direction. It is assumed here that the display area 11 is divided into P×Q imaginary display area units 12. Each of the display area units 12 includes a plurality of pixels. In particular, for example, if the image display resolution of the display area unit 12 satisfies the HD-TV standards and the number $M_0 \times N_0$ of the pixels arranged in a two-dimensional matrix is represented by $(M_0, N_0)$, then the number is (1,920, 1,080). Further, the display area 11 (indicated by alternate long and short dash lines in FIG. 4) formed from the pixels arrayed in a two-dimensional matrix is divided into P×Q imaginary display area units 12 (whose boundaries are indicated by alternate long and short dash lines). The value of (P, Q) typically is (19, 12). It is to be noted, however, that the number of display area units 12 (and area light source units 42 hereinafter described) in FIG. 4 is different from the typical number for the simplified illustration of the drawing. Each of the display area units 12 is composed of a plurality of (M×N) pixels, and the number of pixels which form one display area unit 12 is, for example, approximately 10,000. Each of the pixels is composed of a set of a plurality of sub pixels which emit light of different colors. More particularly, each pixel is composed of three different sub pixels including a red light emitting sub pixel (sub pixel [R]), a green light emitting sub pixel (sub pixel [G]) and a blue light emitting sub pixel (sub pixel [B]). The color liquid crystal display apparatus 10 of the transmission type is line sequentially driven. More particularly, the color liquid crystal display apparatus 10 includes scanning electrodes (extending along the first direction) and data electrodes (extending along the second direction) which cross each other in a matrix. The color liquid crystal display apparatus 10 inputs a scanning signal to the scanning electrodes to select the scanning electrodes to display an image, that is, one screen image, based on a data signal (based on a control signal) inputted to the data electrodes.

Figure 7:
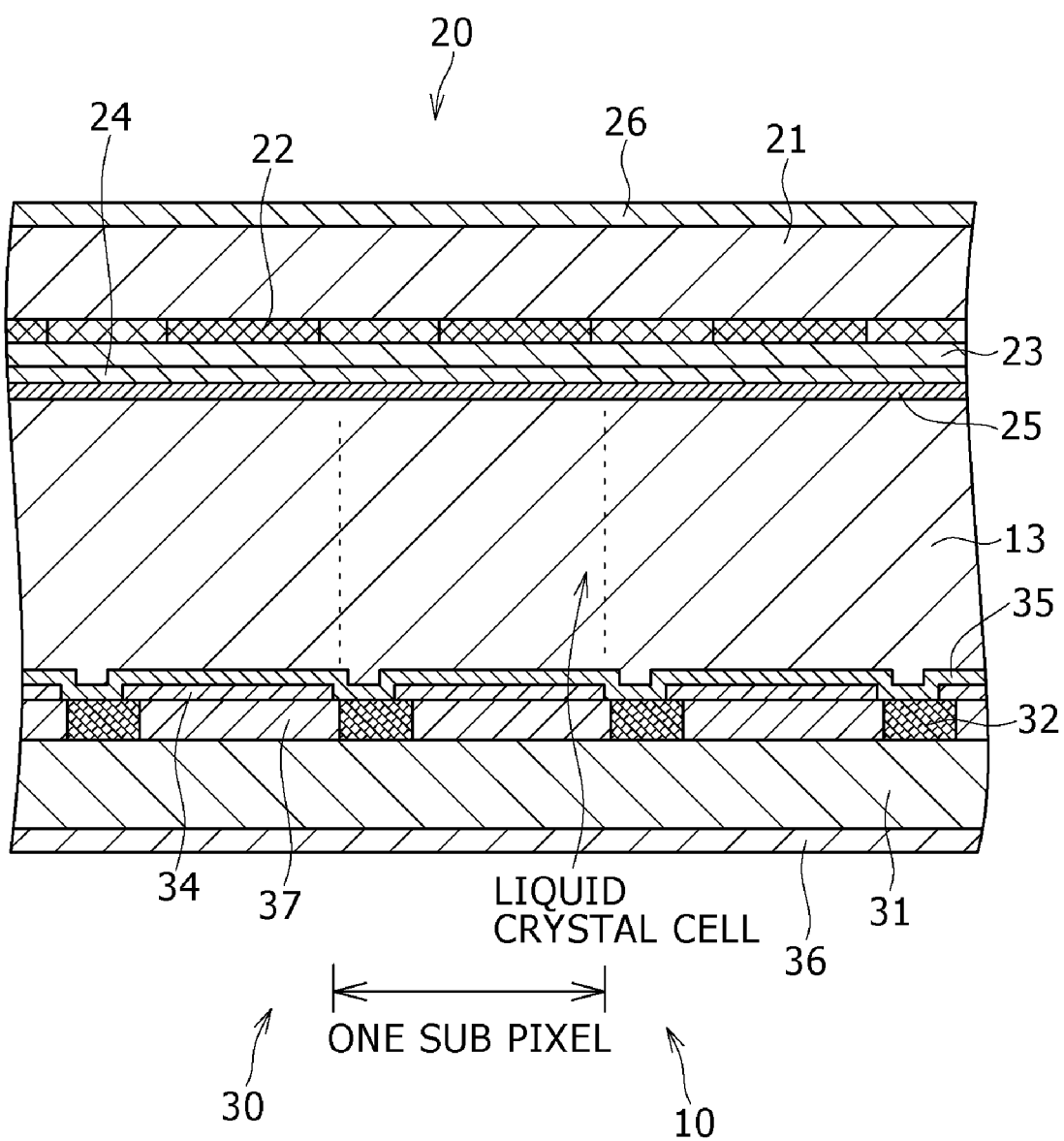
FIG. 7 is a schematic partial sectional view of a color liquid crystal display apparatus.

Referring to FIG. 7, the color liquid crystal display apparatus 10 includes a front panel 20 having a transparent first electrode 24, a rear panel 30 having transparent second electrodes 34, and a liquid crystal material 13 disposed between the front panel 20 and the rear panel 30.

The front panel 20 includes a first substrate 21 formed, for example, from a glass substrate, and a polarizing film 26 provided on the outer face of the first substrate 21. Color filters 22 are provided on the inner face of the first substrate 21 and are coated with an overcoat layer 23 made of an acrylic resin or an epoxy resin. The transparent first electrode 24 (called common electrode and made of, for example, ITO) is formed on the overcoat layer 23, and an orientation film 25 is formed on the transparent first electrode 24. Meanwhile, the rear panel 30 includes a second substrate 31 formed, for example, from a glass substrate, and switching elements 32 (particularly in the form of a thin film transistor TFT) formed on the inner face of the second substrate 31. The rear panel 30 further includes the transparent second electrodes 34 (also called pixel electrodes and made of, for example, ITO) for being controlled by the switching elements 32 between conducting and non-conducting states, and a polarizing film 36 provided on the outer face of the second substrate 31. An orientation film 35 is formed over the overall area including the transparent second electrodes 34. The front panel 20 and the rear panel 30 are joined together at outer peripheries thereof using a bonding agent (not shown). It is to be noted that the switching elements 32 need not be TFTs but may be formed, for example, from MIM elements. Further, an insulating film 37 is provided between adjacent ones of the switching elements 32.

Since the members and the liquid crystal material of the color liquid display apparatus of the transmission type may be selected from known members and materials, detailed description of them is omitted herein.

Figure 6A:
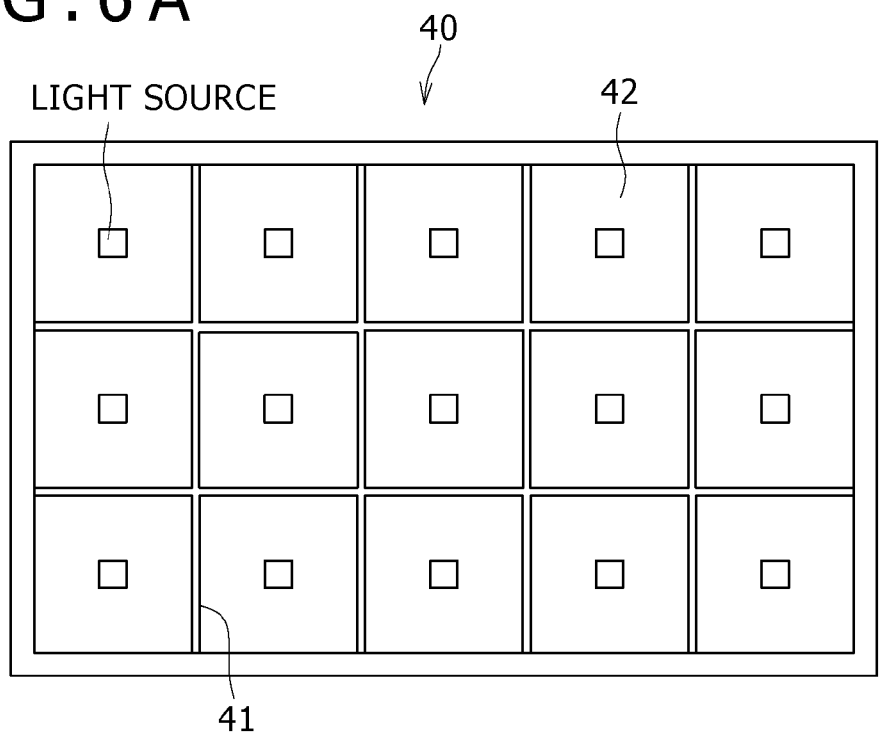
FIG. 6A is a schematic view showing an arrangement state of light emitting element assemblies and so forth in the area light source apparatus of the embodiments of the present invention and FIG. 6B is a schematic partial sectional view of a liquid crystal display apparatus assembly which includes the color liquid crystal display apparatus and the area light source apparatus of the embodiments.
Figure 6B:
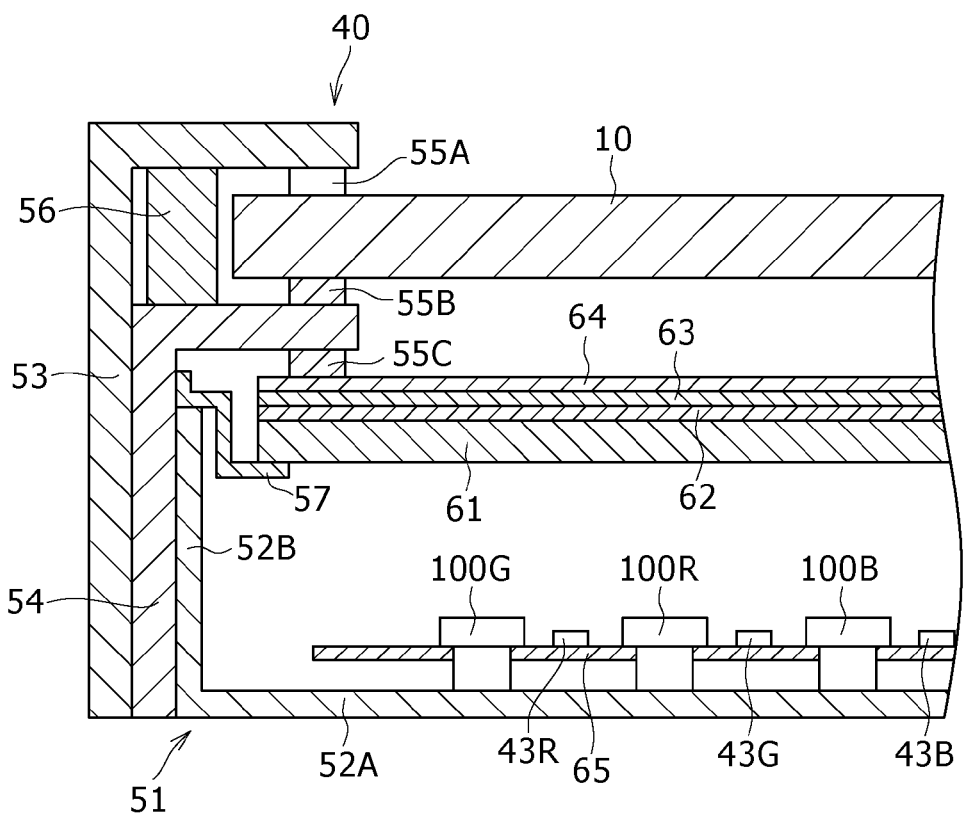

Referring back to FIG. 4, a direct type area light source apparatus 40 (backlight) includes P×Q area light source units 42 corresponding to the P×Q imaginary display area units 12. Each of the area light source units 42 illuminates one of the display area units 12 which corresponds to the area light source unit 42 from the back thereof. The light sources provided in the area light source units 42 are controlled individually. However, the light source luminance of each area light source unit 42 is not influenced by the light emitting state and so forth of the light sources provided in the other area light source units 42. Further, while the area light source apparatus 40 is positioned below the color liquid crystal display apparatus 10, the color liquid crystal display apparatus 10 and the area light source apparatus 40 are shown separately from each other in FIG. 4. The arrangement state of the light emitting element assemblies and so forth of the area light source apparatus 40 is schematically illustrated in FIG. 6A, and a schematic partial section of the liquid crystal display apparatus assembly formed from the color liquid crystal display apparatus 10 and the area light source apparatus 40 is shown in FIG. 6B. Referring to FIGS. 6A and 6B, each light source is formed from a light emitting element assembly 100 which is driven in accordance with a pulse width modulation (PWM) control method. Adjustment of the luminance of each area light source unit 42 is performed through increasing or decreasing control of the duty ratio in pulse width modulation control of the light emitting element assembly 100 which forms the area light source unit 42.

As seen from the schematic partial section of the liquid crystal display apparatus assembly in FIG. 6B, the area light source apparatus 40 includes a housing 51 which in turn includes an outer side frame 53 and an inner side frame 54. An end portion of the color liquid crystal display apparatus 10 of the transmission type is held between and by the outer side frame 53 and the inner side frame 54 with spacers 55A and 55B interposed therebetween, respectively. Further, a guide member 56 is disposed between the outer side frame 53 and the inner side frame 54 so that the color liquid crystal display apparatus 10 held between the outer side frame 53 and the inner side frame 54 may not be displaced. Details of the area light source units 42 are hereinafter described. A light diffusion plate 61 is attached to the inner side frame 54 through a spacer 55C and a bracket member 57 at an upper portion of the inside of the housing 51. Further, optical function sheets such as a diffusion sheet 62, a prism sheet 63 and a polarization conversion sheet 64 are layered on the light diffusion plate 61.

A reflection sheet 65 is provided at a lower portion of the inside of the housing 51. The reflection sheet 65 is attached to a bottom face 52A of the housing 51 through an attaching member not shown such that a reflecting face thereof is opposed to the light diffusion plate 61. The reflection sheet 65 may be formed from an increased silver reflecting film having a structure that a silver reflecting film, a low refractive index film and a high refractive index film are layered in order on a sheet substrate. The reflection sheet 65 reflects light emitted from a plurality of light emitting element assemblies 100 and light reflected by a side face 52B of the housing 51 or a partition wall 41 shown in FIG. 6A. Thus, red light, green light and blue light emitted from red light emitting element assemblies 100R which emit red light, green light emitting element assemblies 100G which emit green light and green light emitting element assemblies 100B which emit blue light can be mixed to produce white light of high color purity as illumination light. The illumination light is emitted from the area light source units 42 through the light diffusion plate 61 and passes through the optical function sheets such as the diffusion sheet 62, prism sheet 63 and polarization conversion sheet 64 to illuminate the color liquid crystal display apparatus 10 from the back.

Photodiodes 43R, 43G, 43B as optical sensors are disposed in the proximity of the bottom face 52A of the housing 51. It is to be noted that the photodiode 43R has a red filter attached thereto for measuring the intensity of red light; the photodiode 43G has a green filter attached thereto for measuring the intensity of green light; and the photodiode 43B has a blue filter attached thereto for measuring the intensity of blue light. Here, one set of optical sensors (photodiodes 43R, 43G, 43B) is disposed for each area light source unit 42. The photodiodes 43R, 43G, 43B as optical sensors measure the luminance and the chromaticity of the light emitting diodes 101R, 101G, 101B, respectively.

Figure 5:
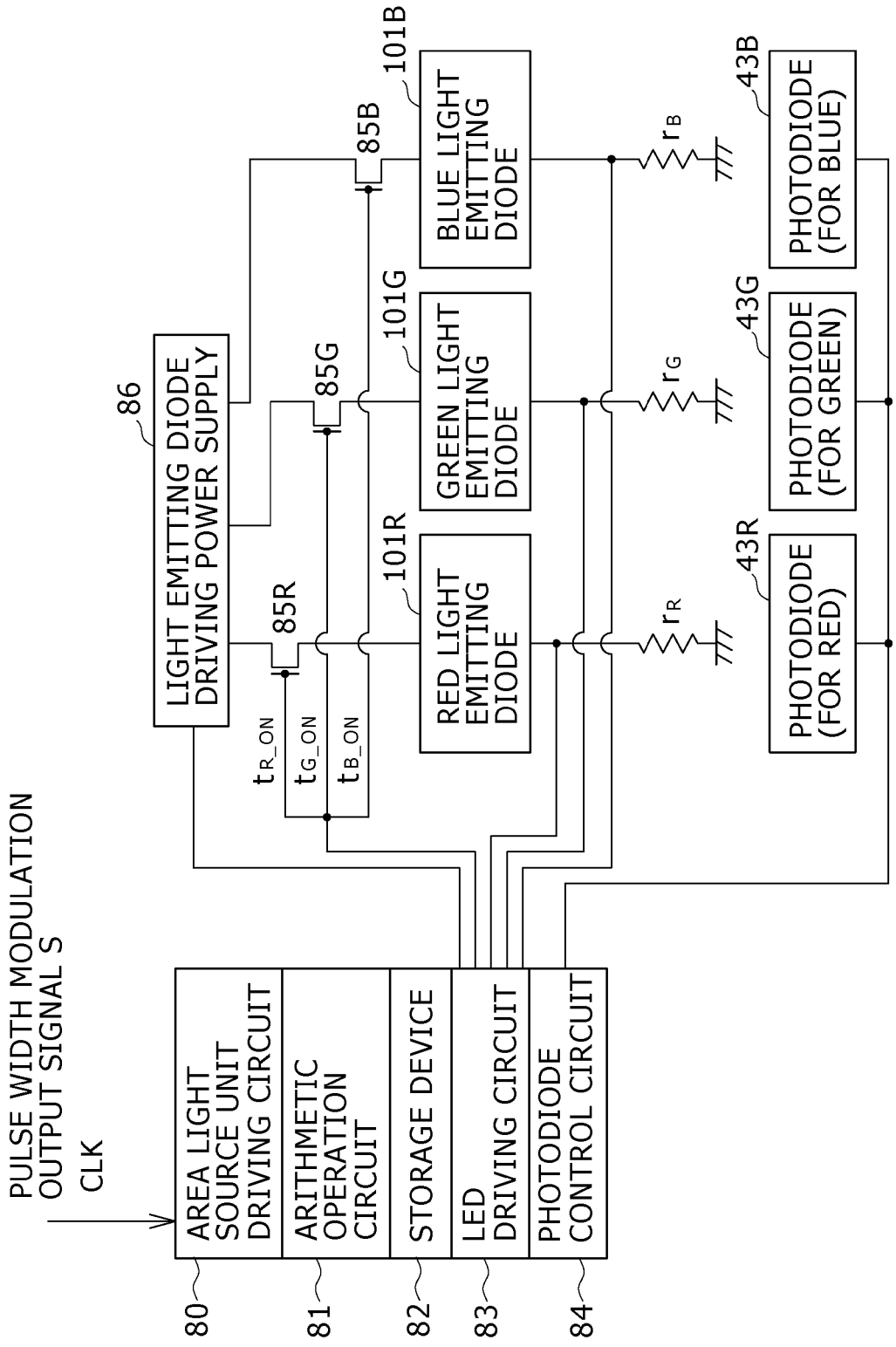
FIG. 5 is a block diagram illustrating a concept of part of a driving circuit suitable for use with the embodiments of the present invention.

Referring to FIGS. 4 and 5, driving circuits for driving the area light source apparatus 40 and the color liquid crystal display apparatus 10 in response to an input signal from the outside (display circuit) include an area light source apparatus control circuit 70 and area light source unit driving circuits 80 for performing on/off control of the red light emitting diodes 101R which form the red light emitting element assemblies 100R, green light emitting diodes 101G which form the green light emitting element assemblies 100G and blue light emitting diodes 101B which form the blue light emitting element assembly 100B, of the area light source apparatus 40 in accordance with a pulse width modulation control method. The driving circuit further includes a liquid crystal display apparatus driving circuit 90.

The area light source apparatus control circuit 70 includes an arithmetic operation circuit 71 and a storage device (memory) 72. Meanwhile, each of the area light source unit driving circuits 80 includes an arithmetic operation circuit 81, a storage device (memory) 82, an LED driving circuit 83, a photodiode control circuit 84, switching elements 85R, 85G, 85B each formed from an FET, and a light emitting diode driving circuit 86 in the form of a constant current source. The circuits and elements mentioned which compose the area light source apparatus control circuit 70 and area light source unit driving circuits 80 may be formed from individually known circuits. Meanwhile, the liquid crystal display apparatus driving circuit 90 for driving the color liquid crystal display apparatus 10 is formed from a known circuit such as a timing controller 91. The color liquid crystal display apparatus 10 includes gate drivers, source drivers and so forth (all not shown) for driving the switching elements 32 each of which forms a liquid crystal cell and is formed from a TFT.

The light emitting state of the light emitting diodes 101R, 101G, 101B in a certain image display frame is measured by the photodiodes 43R, 43G, 43B, and outputs of the photodiodes 43R, 43G, 43B are inputted to the photodiode control circuit 84 and converted into data (signals), for example, of the luminance and the chromaticity of the light emitting diodes 101R, 101G, 101B by the photodiode control circuit 84 and the arithmetic operation circuit 81. The data are sent to the LED driving circuit 83, by which the light emitting state of the light emitting diodes 101R, 101G, 101B in a next image data display frame is controlled based on the data. In this manner, a feedback mechanism is formed.

Resistors $r_R$, $r_G$, $r_B$ for current detection are inserted in series to the light emitting diodes 101R, 101G, 101B on the downstream of the light emitting diodes 101R, 101G, 101B, respectively, and current flowing through the resistors $r_R$, $r_G$, $r_B$ is converted into voltages. Operation of the light emitting diode driving circuit 86 is controlled under the control of the LED driving circuit 83 so that the voltage drops of the resistors $r_R$, $r_G$, $r_B$ may have a predetermined value. While the single light emitting diode driving circuit (constant current source) 86 is shown in FIG. 5, actually light emitting diode driving circuits 86 for individually driving the light emitting diodes 101R, 101G, 101B are provided.

While the display area 11 including pixels arranged in a two dimensional matrix are divided in P×Q display area units, where this state is represented in "row" and "column", it is considered that the display area 11 is divided in display area units of P rows×Q columns. Further, while each display area unit 12 is formed from a plurality of (M×N) pixels, where this state is represented in "row" and "column", it is considered that the display area unit 12 is formed from pixels of N rows×M columns. Further, a red light emitting sub pixel (sub pixel [R]), a green light emitting sub pixel (sub pixel [G]) and a blue light emitting sub pixel (sub pixel [B]) are sometimes referred to collectively as "sub pixels [R, G, B]". Further, a red light emitting sub pixel control signal, a green light emitting sub pixel control signal and a blue light emitting sub pixel control signal inputted to the sub pixels [R, G, B] for control of operation of the sub pixels [R, G, B] (particularly, for example, for control of the light transmittance (numerical aperture)) are sometimes referred to collectively as "control signals [R, G, B]". Furthermore, a red light emitting sub pixel input signal, a green light emitting sub pixel input signal and a blue light emitting sub pixel input signal inputted from the outside to the driving circuits for driving the sub pixels [R, G, B] which compose a display area unit are sometimes referred to collectively as "input signals [R, G, B]".

Each pixel is composed of a set of three different sub pixels including a red light emitting sub pixel (sub pixel [R]), a green light emitting sub pixel (sub pixel [G]) and a blue right emitting sub pixel (sub pixel [B]). In the following description, control (gradation control) of the luminance of each of the sub pixels [R, G, B] is performed in 8 bits and hence at $2^8$ stages from 0 to 255. Accordingly, each of the values $x_R$, $x_G$, $x_B$ of the input signals [R, G, B] inputted to the liquid crystal display apparatus driving circuit 90 in order to drive the sub pixels [R, G, B] of each of the pixels which compose the display area units 12 can assume values of $2^8$ stages. Also the values $S_R$, $S_G$, $S_B$ of pulse width modulation output signals for controlling the light emission time of the red light emitting element assembly 100R, green light emitting element assembly 100G and blue light emitting element assembly 100B which compose each area light source unit can assume the values of $2^8$ stages from 0 to 255. It is to be noted that the values mentioned above are not particularly limited to those value given above. For example, 10-bit control may be adopted instead so that the control can be performed among $2^{10}$ stages from 0 to 1,023. In this instance, a representation of a numerical value of 8 bits may be, for example, multiplied by four.

To each pixel, a control signal for controlling the light transmittance Lt of the pixel is supplied from a driving circuit. In particular, control signals [R, G, B] for controlling the light transmittance Lt of sub pixels [R, G, B] are supplied from the liquid crystal display apparatus driving circuit 90 to the sub pixels [R, G, B], respectively. In particular, the liquid crystal display apparatus driving circuit 90 produces control signals [R, G, B] from input signals [R, G, B] inputted thereto and supplies or outputs the control signals [R, G, B] to the sub pixels [R, G, B]. It is to be noted that, since the light source luminance $Y_2$ which is the luminance of an area light source unit 42 is varied for each one image display frame, the control signals [R, G, B] have values $x_{R-corr}$, $x_{G-corr}$, $x_{B-corr}$ obtained, for example, by performing correction (compensation) based on the variation of the light source luminance $Y_2$ for values obtained by raising the values $x_R$, $x_G$, $x_B$ of the input signals [R, G, B] to the 2.2th power. Then, the control signals [R, G, B] are signaled by a known method from the timing controller 91 of the liquid crystal display apparatus driving circuit 90 to the gate drivers and the source drivers of the color liquid crystal display apparatus 10. Thus, the switching elements 32 which form the sub pixels are driven in accordance with the control signals [R, G, B] to apply desired voltages to the transparent first electrode 24 and the transparent second electrodes 34 which compose the liquid cells thereby to control the light transmittance Lt (numerical aperture) of the sub pixels. Here, as the values $x_{R-corr}$, $x_{G-corr}$, $x_{B-corr}$ of the control signals [R, G, B] increase, the light transmittances (numerical apertures) Lt of the sub pixels [R, G, B] increase and the luminance (display luminance y) at a portion of the display region corresponding to the sub pixels [R, G, B] increases. In other words, the image formed from light which passes through the sub pixels [R, G, B] (usually having a form of dot) becomes brighter.

The control of the display luminance y and the light source luminance $Y_2$ is performed for each one image display frame, for each display area unit and for each area light source unit in image display of the color liquid crystal display apparatus 10. Further, operation of the color liquid crystal display apparatus 10 and operation of the area light source apparatus 40 in one image display frame are synchronized with each other. It is to be noted that the number of pieces of image information sent as an electric signal to the driving circuits for one second, that is, the number of images per one second, is the frame frequency (frame rate), and the reciprocal number to the frame frequency is frame time (unit: second).

Embodiment 1

Figure 1A:
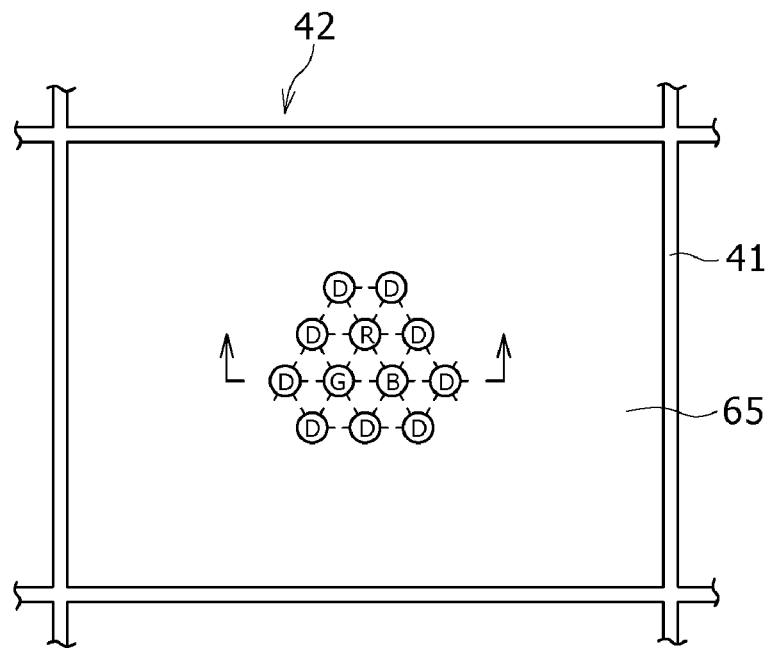
FIGS. 1A and 1B is a schematic top plan view showing an area light source unit used to form an area light source apparatus according to a first embodiment of the present invention and a schematic side elevational view of the area light source unit as viewed in a direction indicated by arrow marks in FIG. 1A, respectively.
Figure 1B:
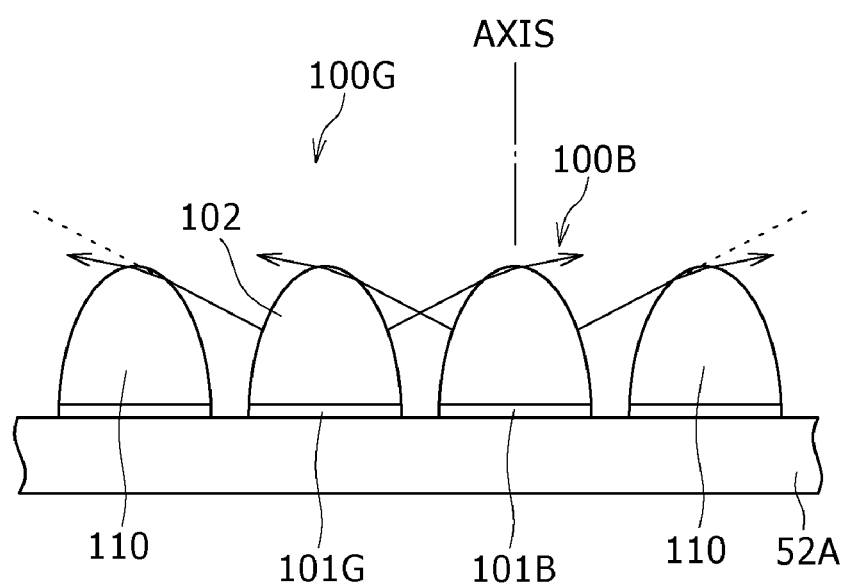

The Embodiment 1 according to the present invention relates to an area light source apparatus and a liquid crystal display apparatus assembly. FIG. 1a shows an area light source unit 42 of the area light source apparatus 40 according to the Embodiment 1 as viewed from above, and FIG. 1B shows the area light source unit 42 as viewed from sidewardly as viewed in the direction indicated by an arrow mark in FIG. 1A.

The area light source apparatus 40 includes P×Q area light source units 42 as described hereinabove. Each of the area light source units 42 includes a plurality of light emitting element assemblies 100R, 100G, 100B each including a light emitting element (light emitting diode 101) and a lens 102 through which light emitted from the light emitting element (light emitting element 101) passes and serving as a light source. The light emitting element assemblies 100R, 100G, 100B are secured to the bottom face 52A of the housing 51 by a suitable method. Further, the lens 102 is secured using a bonding agent in such a manner as to cover the light emitting element (light emitting diode 101). It is to be noted that the lens 102 may be secured by caulking to the light emitting element (light emitting diode 101). The light emitting diodes 101R, 101G, 101B are driven in accordance with a pulse width modulation (PWM) control method, and the red light emitting diode 101R emits light of a red color (for example, of a wavelength 640 nm); the green light emitting diode 101G emits light of a green color (for example, of a wavelength of 530 nm); and the blue light emitting diode 101B emits light of a blue color (for example, of a wavelength of 450 nm).

Dummy lenses 110 same as the lens 102 used to form the light emitting element assemblies 100R, 100G, 100B are disposed in the proximity of the light emitting element assemblies 100R, 100G, 100B. In particular, each of the dummy lenses 110 is formed from an inoperative light emitting element assembly (which has a same configuration and structure as those of the light emitting element assemblies but does not emit light). However, the dummy lenses 110 need not have the configuration just described, but each of the dummy lenses 110 may be formed from a single lens. The dummy lenses 110 are disposed particularly in a region in which light emitted from the lens 102 which composes each light emitting element assembly 100 enters directly into the dummy lenses 110. The lenses 102 and the dummy lenses 110 are produced by injection molding from an acrylic resin material and are designed so as to obtain light emitting element assemblies which exhibit an isotropic light intensity distribution like the Lambertian distribution. It is to be noted that, in FIG. 1A and also in FIGS. 2A, 2B and 2C, the light emitting element assemblies 100R, 100G, 100B are indicated by round marks to which "R", "G" and "B" are applied, respectively.

When light emitted from a certain light emitting element assembly enters a lens which composes a different light emitting element assembly and then emerges from the lens in this manner, such a situation that radiation of the light emitted from the certain light emitting element assembly becomes asymmetrical with respect to an axis of the light emitting element assembly can be prevented due to the presence of the dummy lenses 110. As a result, occurrence of such a problem that, in a space above the light emitting diode assembly group, a region within which the mixture state of red light, green light and blue light is non-uniform increases can be suppressed with certainty. It is to be noted that, in FIG. 1B, light emitted from a certain light emitting element assembly (green light emitting element assembly 100G or 100B) and entering and emerging from a dummy lens 110 is indicated by a solid line. Meanwhile, an emerging state of light emitted from a certain light emitting element assembly (light emitting element assembly 100G or 100B) where no dummy lens 110 exists is indicated by a broken line.

Further, in the Embodiment 1, different light emitting element assemblies are disposed in the proximity of each one light emitting element assembly. Such different light emitting element assemblies are disposed in a region wherein light emitted from a lens of the one light emitting element assembly directly enters the different light emitting element assemblies.

In the Embodiment 1, one light emitting element assembly group is formed from a plurality of light emitting element assemblies positioned at the vertices of one imaginary regular triangle indicated by broken lines, particularly, from one red light emitting element assembly 100R, one green light emitting element assembly 100G and one blue light emitting element assembly 100B. Further, a plurality of dummy lenses, particularly, nine dummy lenses 110, are disposed so as to be positioned, on the outer side of the one light emitting element assembly group, at the vertices of imaginary regular triangles of the same shape as that of the imaginary regular triangle.

Figure 3:
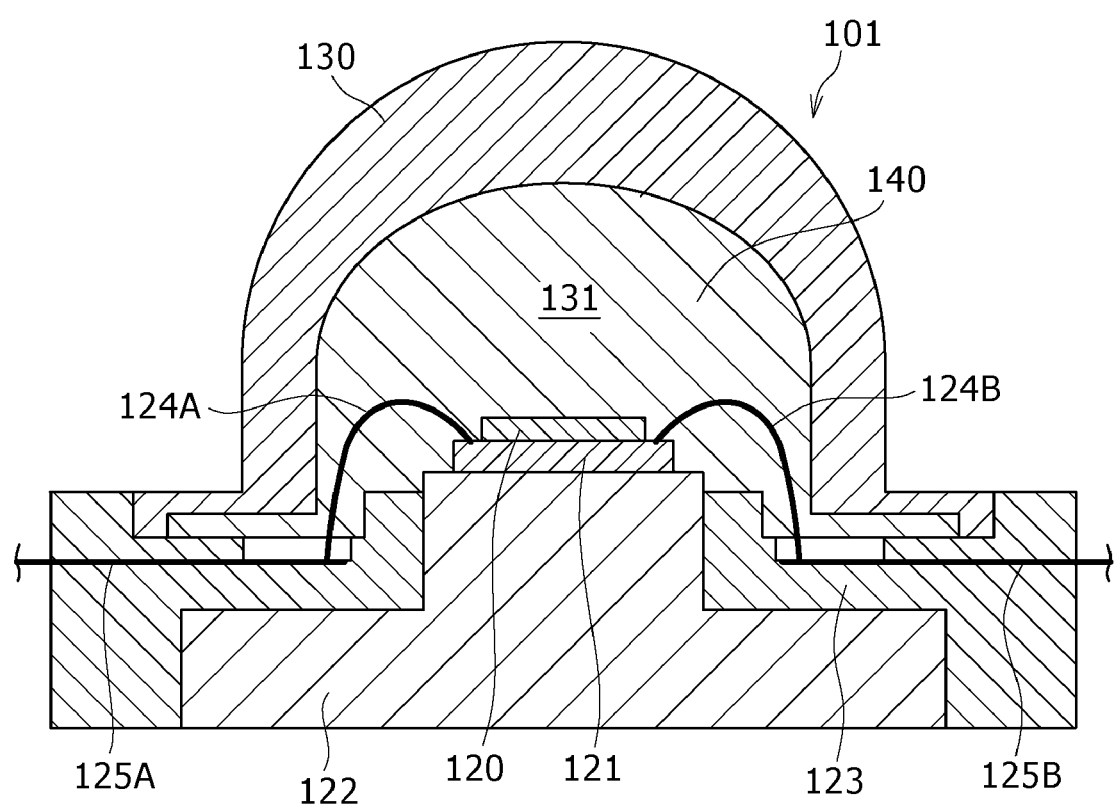
FIG. 3 is a schematic sectional view of a light emitting diode.

Each light emitting diode 101 has such a section as seen in FIG. 3. Referring to FIG. 3, the light emitting diode 101 shown includes a light emitting layer 120 secured to a substrate, and a cap 130 made of a plastic material. In particular, the cap 130 is placed at a light emerging portion of the light emitting layer 120. The cap 130 covers the light emitting layer 120 with a space 131 interposed therebetween. More particularly, the light emitting layer 120 is fixed to a sub mount 121 and electrically connected to external electrodes 125A and 125B through wiring lines (not shown) provided on the sub mount 121 and gold wires 124A and 124B. The external electrodes 125A and 125B are electrically connected to a driving circuit (not shown). The sub mount 121 is attached to a heat sink 122 by a bonding agent, and the heat sink 122 is attached to the support member 123. A filler 140 which is transparent with respect to light emitted from the light emitting layer 120 is filled in the space 131 between the cap 130 and the light emitting diode 101. The cap 130 is made of an acrylic resin material and molded by injection molding. Further, the substrate is formed from a support member 123 made of a PMMA resin material and molded by injection molding and the heat sink 122. The filler 140 is made of a gel-like material, a fluorene type acrylic resin material, silicone rubber or a silicon oil compound and has a refractive index of 1.40 or more. More particularly, as the gel-like material, for example, OCK-451 (refractive index: 1.51) or OCK-433 (refractive index: 1.46) by Nye can be used, or an oil compound material such as silicone rubber or a silicone oil compound such as, for example, TSK5353 (refractive index: 1.45) by Toshiba Silicone can be used. Since such a filler 140 as described is filled in the space 131, light emitted from the light emitting layer 120 can advance into the cap 130 with certainty without being totally reflected by the cap 130. In other words, if light emitting from the light emitting layer 120 is totally reflected by the cap 130, then since the totally reflected light is re-absorbed into the light emitting layer 120, such a problem that the light extraction efficiency drops occurs. However, where the filler 140 is filled in the space 131, occurrence of such a problem as just described can be prevented with certainty.

Embodiment 2

Figure 2A:
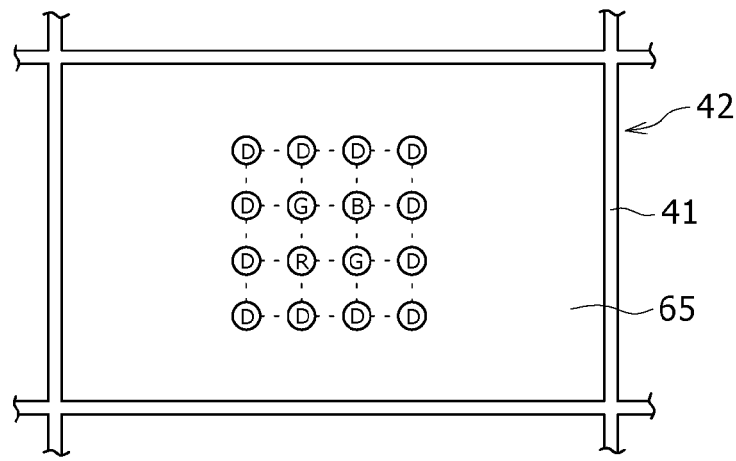
FIGS. 2A, 2B and 2C are schematic top plan views showing different area light source units which form an area light source according to a second embodiment of the present invention.
Figure 2B:
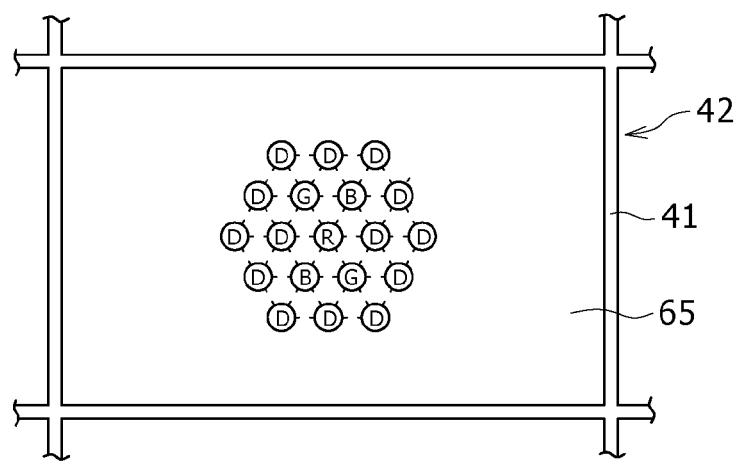
Figure 2C:
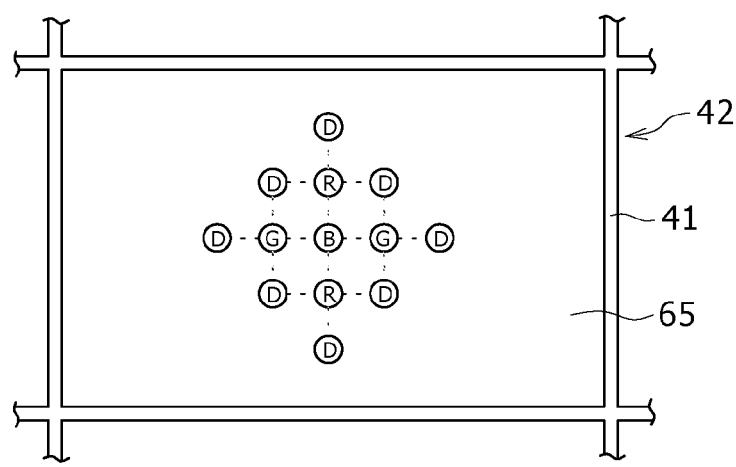

The Embodiment 2 is a modification to the Embodiment 1. The area light source unit 42 of the area light source apparatus 40 according to the Embodiment 2 may have such top plan arrangements as seen in FIGS. 2A, 2B and 2C. In the arrangement shown in FIG. 2A, one light emitting element assembly group is formed from a plurality of light emitting element assemblies, particularly one red light emitting element assembly 100R, two green light emitting element assemblies 100G and one blue light emitting element assembly 100B, positioned at the vertices of one imaginary square (indicated by broken lines). Further, a plurality of dummy lenses, particularly 12 dummy lenses 110, are disposed on the outer side of the light emitting element assembly group such that they are positioned at the vertices of imaginary squares of a shape same as that of the imagery square. Meanwhile, in the arrangement shown in FIG. 2B, one light emitting element assembly group is formed from a plurality of light emitting element assemblies, particularly one red light emitting element assembly 100R, two green light emitting element assemblies 100G and two blue light emitting element assemblies 100B, positioned at the vertices of two imaginary regular triangles indicated by broken lines. Further, a plurality of dummy lenses, particularly 14 light emitting element assemblies 100, are disposed on the outer side of the light emitting element assembly group such that they are positioned at the vertices of imaginary regular triangles having a shape same as that of the imaginary regular triangle. Further, in the arrangement shown in FIG. 2C, one light emitting element assembly group is formed from a plurality of light emitting element assemblies, particularly one blue light emitting element assembly 100B, two red light emitting element assemblies 100R and two green light emitting element assemblies 100G, disposed in a cross shape. Further, a plurality of dummy lenses, particularly eight light emitting element assemblies 100, are disposed on the outer side of the light emitting element assembly group such that each of them is positioned at the center of a cross shape. Except the featured described above, the area light source apparatus 40 or the color liquid crystal display apparatus 10 may have a configuration and structure similar to those of the area light source apparatus 40 or the color liquid crystal display apparatus 10 of the Embodiment 1. Therefore, more detailed description of the configuration or structure is omitted herein to avoid redundancy.

Figure 8:
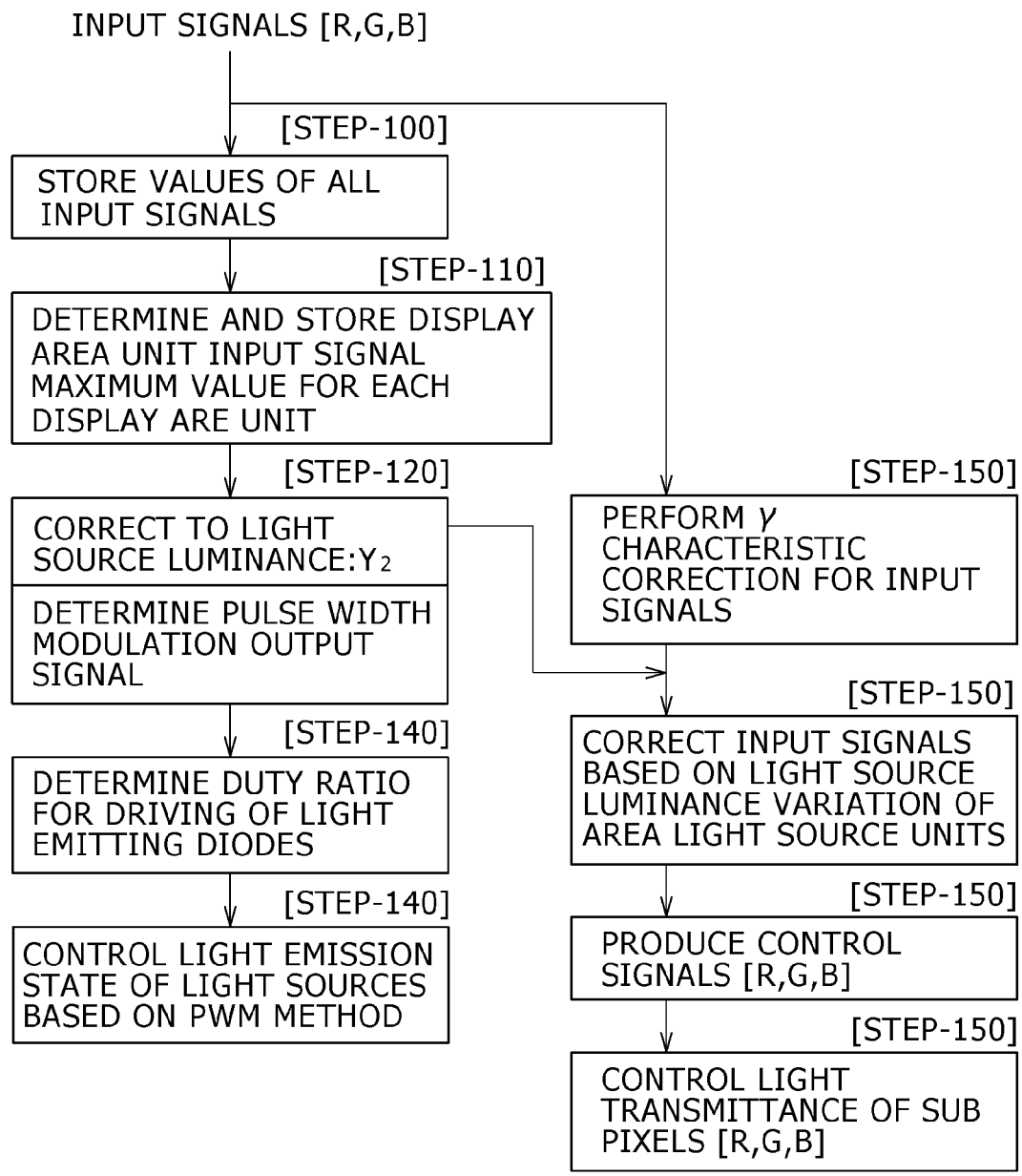
FIG. 8 is a flow chart illustrating a driving method for the liquid crystal display apparatus assembly according to the first and second embodiments.

In the following, a driving method for a liquid crystal display apparatus assembly in the Embodiment 1 and the Embodiment 2 is described with reference to FIGS. 4, 5 and 8. It is to be noted that FIG. 8 illustrates a driving method for the liquid crystal display apparatus assembly in the Embodiment 1 and the Embodiment 2.

In the Embodiment 1 and the Embodiment 2, a control signal for controlling the light transmittance Lt of a pixel is supplied to each of the pixels from the driving circuit. More particularly, control signals [R, G, B] for controlling the light transmittance Lt of the sub pixels [R, G, B] which compose each pixel are supplied from the liquid crystal display apparatus driving circuit 90 to the sub pixels [R, G, B]. Then, in each of the area light source units 42, the luminance of the light source which compose the area light source unit 42 corresponding to a display area unit 12 is controlled by the area light source apparatus control circuit 70 and an area light source unit driving circuit 80 so that the luminance of all of the pixels which compose the display area unit 12, that is, a display luminance second prescribed value $y_2$ at a light transmittance first prescribed value $Lt_1$, may be obtained where it is assumed that a control signal corresponding to an input signal having a value equal to a display area unit input signal maximum value $x_{U\text{-}max}$, which is a maximum value among the values $x_R, x_G, x_B$ of the input signals [R, G, B] inputted to the driving circuits 70, 80 and 90 in order to drive all pixels (sub pixels [R, G, B]) of the display area unit 12. More particularly, the light source luminance $Y_2$ may be controlled, for example, decreased, so that, for example, the display luminance second prescribed value $y_2$ may be obtained when the light transmittance (numerical aperture) of the pixels or sub pixels is set to the light transmittance first prescribed value $Lt_1$. In other words, the light source luminance $Y_2$ may be controlled for each image display frame so that, for example, the following expression (1) may be satisfied:

$$Y_2 \cdot Lt_1 = Y_1 \cdot Lt_2 \tag{1}$$

where $y_2$ and $Y_2$ have a relationship of $Y_2 \leq Y_1$.

[Step-100]

Input signals [R, G, B] and a clock signal CLK for one image display frame signaled from a known display circuit such as a scan converter are inputted to the area light source apparatus control circuit 70 and the liquid crystal display apparatus driving circuit 90 (refer to FIG. 4). It is to be noted that the input signals [R, G, B] are output signals, for example, from an image pickup tube when the input light amount to the image pickup tube is y' and are input signals which are outputted, for example, from a broadcasting station and inputted also to the liquid crystal display apparatus driving circuit 90 in order to control the light transmittance Lt of the pixels, and can be represented by a function of the input light amount y' to the 0.45th power. The values $x_R, x_G, x_B$ of the input signals [R, G, B] for one image display frame inputted to the area light source apparatus control circuit 70 are stored once into the storage device (memory) 72 which composes the area light source apparatus control circuit 70. Meanwhile, also the values $x_R, x_G, x_B$ of the input signals [R, G, B] for one image display frame inputted to the liquid crystal display apparatus driving circuit 90 are stored once into a storage device (not shown) which composes the liquid crystal display apparatus driving circuit 90.

[Step-110]

Then, in the arithmetic operation circuit 71 which composes the area light source apparatus control circuit 70, the values of the input signals [R, G, B] stored in the storage device 72 are read out. Then, the arithmetic operation circuit 71 determines the display area unit input signal maximum value $x_{U\text{-}max}$ which is a maximum value among the values $x_R, x_G, x_B$ of the input signals [R, G, B] for driving the sub pixels [R, G, B] in all pixels which compose the (p, q)th display area unit 12 [first, p=1, q=1]. Then, the display area unit input signal maximum value $x_{U\text{-}max}$ is stored into the storage device 72. The processes at this step are executed for all of m=1, 2, . . . , M, n=1, 2, . . . , N, that is, for all of the M×N pixels.

For example, where $x_R$ has a value corresponding to "110" and $x_G$ has another value corresponding to "150" while $x_B$ has a value corresponding to "50", the display area unit input signal maximum value $x_{U\text{-}max}$ has a value corresponding to "150".

This operation is repeated from (p, q)=(1, 1) to (p, q)=(P, Q), and the display area unit input signal maximum values $x_{U\text{-}max}$ of all display area units 12 are stored into the storage device 72.

[Step-120]

Figure 10A:
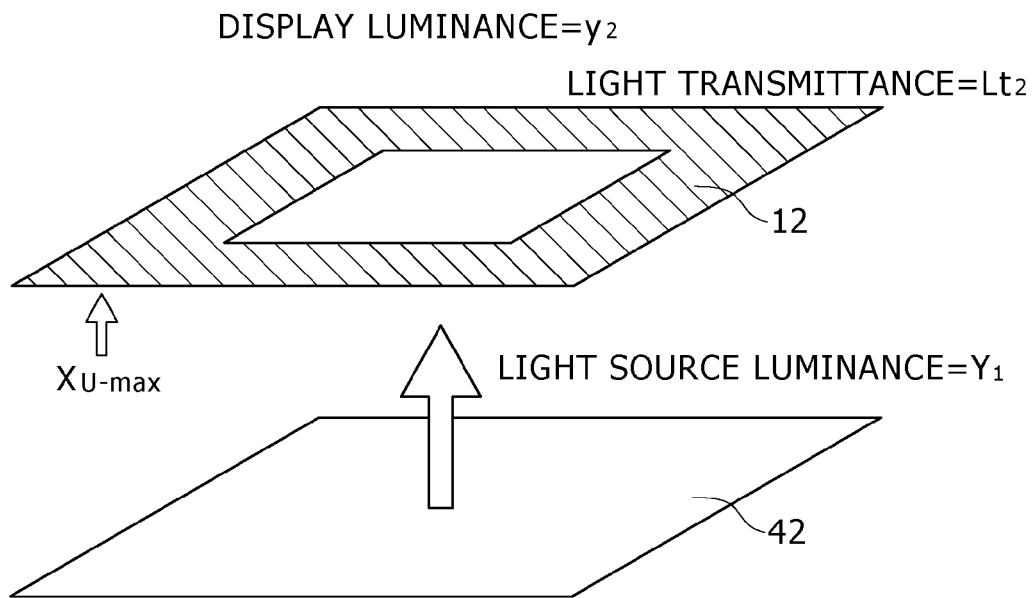
FIGS. 10A and 10B are schematic views illustrating a concept of a state of adjusting, under the control of an area light source unit driving circuit, the light source luminance of an area light source unit so that a display luminance second prescribed value when it is assumed that a control signal corresponding to an input signal having a value equal to a display area unit input signal maximum value is supplied to pixels may be obtained by the area light source unit.
Figure 10B:
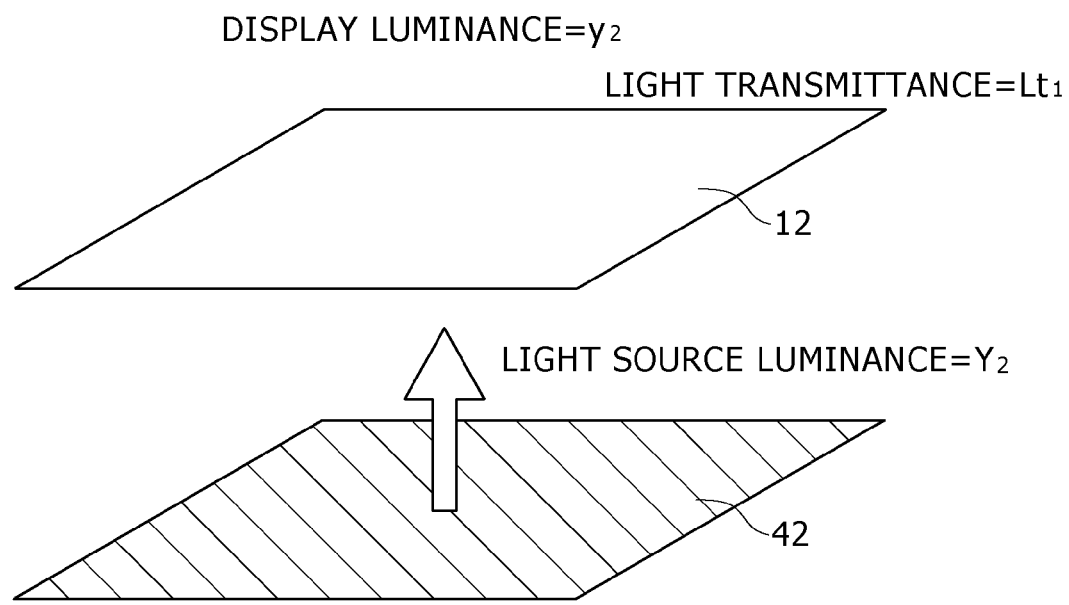
Figure 11A:
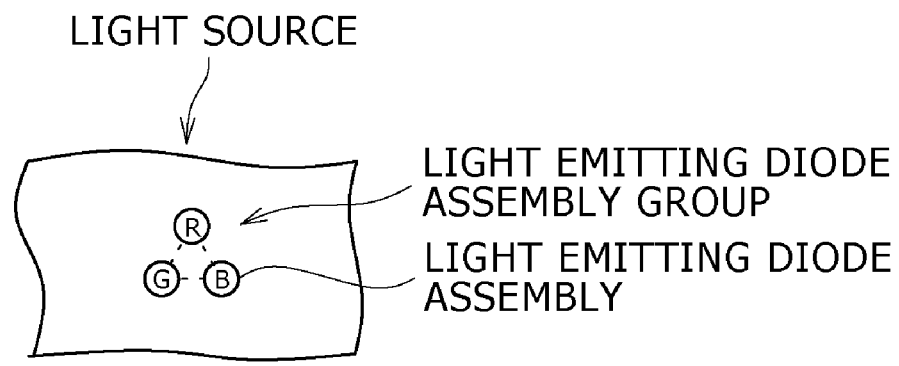
FIGS. 11A and 11B are a schematic top plan view and a schematic side elevational view, respectively, of a red light emitting diode assembly, a green light emitting diode assembly and a blue light emitting diode assembly which compose a light emitting diode assembly group in the related art.
Figure 11B:
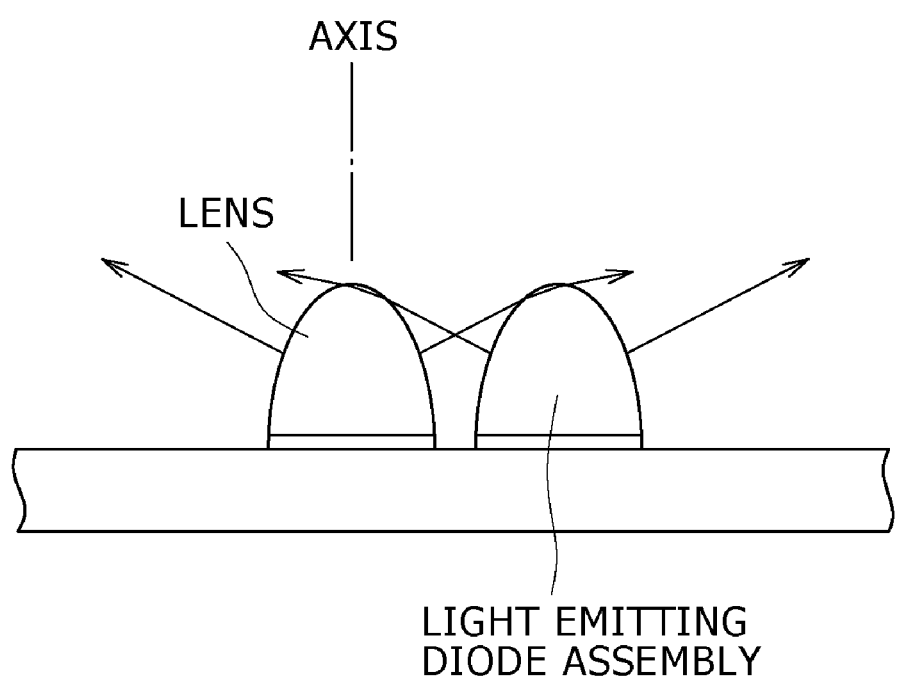

Then, the light source luminance $Y_2$ of the area light source unit 42 corresponding to the display area unit 12 is adjusted under the control of the area light source unit driving circuit 80 so that the luminance when it is assumed that the control signals [R, G, B] corresponding to the input signals [R, G, B] having values equal to the display area unit input signal maximum value $x_{U\text{-}max}$ are supplied to the sub pixels [R, G, B], that is, the display luminance second prescribed value $y_2$ at the light transmittance first prescribed value $Lt_1$, may be obtained by the area light source unit 42. In particular, the light source luminance $Y_2$ may be controlled for each one image display frame and for each one area light source unit so that the expression (1) given hereinabove may be satisfied. More particularly, the luminance of the light emitting element assembly 100 may be controlled based on an expression (2) given below which represents a light source luminance control function $g(x_{nol\text{-}max})$ while the light source luminance $Y_2$ is controlled so as to satisfy the expression (1). A concept of such control as just described is illustrated in FIGS. 10A and 10B. It is to be noted, however, that, as hereinafter described, correction based on the influence of other area light source units 42 is performed for the light source luminance $Y_2$ as occasion demands. Further, as hereinafter described, the relationships relating to the control of the light source luminance $Y_2$, that is, the relationship among the display area unit input signal maximum value $x_{U\text{-}max}$, the values of the control signals corresponding to the input signals having a value equal to the display area unit input signal maximum value $x_{U\text{-}max}$, the display luminance second prescribed value $y_2$ when it is assumed that such control signals are supplied to the pixels (sub pixels), the light transmittance (numerical aperture) [light transmittance second prescribed value $Lt_2$] of the sub pixels at this time and the luminance control parameters in the area light source units 42 with which the display luminance second prescribed value $y_2$ is obtained where the light transmittance (numerical aperture) of the sub pixels is set to the light transmittance first prescribed value $Lt_1$ and so forth may be determined in advance and stored into the storage device 72 or the like.

$$g(x_{nol\text{-}max}) = a_1 \cdot (x_{nol\text{-}max})^{2.2} + a_0 \tag{2}$$

Here, where the maximum value of the input signals (input signals [R, G, B]) inputted to the liquid crystal display apparatus driving circuit 90 in order to drive the pixels (or the sub pixels [R, G, B] which compose the pixels) is represented by $x_{max}$, it can be represented by $$x_{nol\text{-}max} = x_{U\text{-}max}/x_{max}$$

where $a_1$ and $a_0$ are constants and satisfy $$a_1 + a_0 = 1$$

$$0 < a_0 < 1, 0 < a_1 < 1$$

For example, the constants $a_1$ and $a_0$ may be set to $$a_1 = 0.99$$

$$a_0 = 0.01$$

Further, since each of the values $x_R, x_G, x_B$ of the input signals [R, G, B] can assume values of $2^8$ stages, the value of $x_{max}$ corresponds to "255".

Incidentally, in the area light source apparatus 40, for example, if luminance control of the (p, q)=(1, 1) area light source unit 42 is assumed, then it is sometimes necessary to take the influence from the other P×Q area light source units 42 into consideration. Since such an influence upon the area light source unit 42 from the other area light source units 42 is known in advance from a light emission profile of each area light source unit 42, the difference can be calculated by backward calculation, and consequently, correction can be performed based on the difference. A basic form of the arithmetic operation is described below.

The luminance (light source luminance $Y_2$) necessary for the P×Q area light source units 42 based on the requirements of the expressions (1) and (2) is represented by a matrix $[L_{P \times Q}]$. Meanwhile, the luminance of a certain area light source unit obtained when only the certain area light source is driven while the other area light source units are not driven is determined in advance with regard to the P×Q area light source units 42. The luminance mentioned is represented by a matrix $[L'_{P \times Q}]$. Further, correction coefficients are represented by a matrix $[\alpha_{P \times Q}]$. In this instance, a relationship of the matrices can be represented by the following expression (3-1). The matrix $[\alpha_{P \times Q}]$ of the correction coefficients can be determined in advance.

$$[L_{P \times Q}] = [L'_{P \times Q}] \cdot [\alpha_{P \times Q}] \quad (3\text{-}1)$$

Therefore, the matrix $[L'_{P \times Q}]$ may be determined from the expression (3-1). The matrix $[L'_{P \times Q}]$ can be determined by arithmetic operation of an inverse matrix. That is, $$[L'_{P \times Q}] = [L_{P \times Q}] \cdot [\alpha_{P \times Q}]^{-1} \quad (3\text{-}2)$$

should be calculated. Then, the light sources (light emitting element assemblies 100) provided in the area light source units 42 should be controlled so that the luminance values represented by the matrix $[L'_{P \times Q}]$ may be obtained. In particular, such operation and process may be performed using information (data table) stored in the storage device (memory) 82. It is to be noted that, since, in the control of the light emitting element assemblies 100, the values of the matrix $[L'_{P \times Q}]$ may not assume negative values, naturally it is necessary to cause a result of the arithmetic operation to remain within the positive region. Accordingly, the solution of the expression (3-2) may be not an exact solution but an approximate solution.

The matrix $[L'_{P \times Q}]$ of the luminance when it is assumed that an area light source unit is driven solely as described above is determined based on the matrix $[L_{P \times Q}]$ and the matrix $[a_{P \times Q}]$ of correction coefficients obtained based on the values of the expressions (1) and (2) obtained by the arithmetic operation circuit 71 of the area light source apparatus control circuit 70 in this manner. Further, the matrix $[L'_{P \times Q}]$ of the luminance is converted into integers within the range of 0 to 255, that is, values of the pulse width modulation output signal. In this manner, the arithmetic operation circuit 71 of the area light source apparatus control circuit 70 can determine the value $S_R$ of the pulse width modulation output signal for controlling the light emission time of the red light emitting diode 101R in the area light source unit 42, the value $S_G$ of the pulse width modulation output signal for controlling the light emission time of the green light emitting diode 101G and the value $S_B$ of the pulse width modulation output signal for controlling the light emission time of the blue light emitting diode 101B.

[Step-130]

Then, the values $S_R$, $S_G$, $S_R$ of the pulse width modulation output signals obtained by the arithmetic operation circuit 71 of the area light source apparatus control circuit 70 are signaled to the storage device 82 of the area light source unit driving circuit 80 provided corresponding to the area light source unit 42 and stored into the storage device 82. Also the clock signal CLK is signaled to the area light source unit driving circuit 80 (refer to FIG. 5).

[Step-140]

Then, the arithmetic operation circuit 81 determines on time $t_{R\text{-}ON}$ and off time $t_{R\text{-}OFF}$ of the red light emitting diode 101R of the area light source unit 42, on time $t_{R\text{-}ON}$ and off time $t_{G\text{-}OFF}$ of the green light emitting diode 101G and on time $t_{B\text{-}ON}$ and off time $t_{B\text{-}OFF}$ of the blue light emitting diode 101B based on the values $S_R$, $S_G$, $S_B$ of the pulse width modulation output signal. It is to be noted that $$t_{R\text{-}ON} + t_{R\text{-}OFF} = t_{G\text{-}ON} + t_{G\text{-}OFF}$$
$$= t_{B\text{-}ON} + t_{B\text{-}OFF}$$
$$= \text{fixed value } t_{Const}$$

Meanwhile, the duty ratio in driving based on pulse width modulation of a light emitting diode can be represented by $$t_{ON}/(t_{ON}+t_{OFF}) = t_{ON}/t_{Const}$$

Then, signals corresponding to the on time $t_{R\text{-}ON}/t_{G\text{-}ON}$, $t_{B\text{-}ON}$ of the red light emitting diode 101R, green light emitting diode 101G and blue light emitting diode 101B which compose the area light source unit 42 are sent to the LED driving circuit 83. The LED driving circuit 83 controls the switching elements 85R, 85G, 85B based on the values of the signals corresponding to the on time $t_{R\text{-}ON}$, $t_{G\text{-}ON}$, $t_{B\text{-}ON}$ so that LED driving current is supplied from the light emitting diode driving circuit 86 to the light emitting diodes 101R, 101G, 101B. As a result, the light emitting diodes 101R, 101G, 101B emit light for the on time $t_{R\text{-}ON}$, $t_{G\text{-}ON}$, $t_{B\text{-}ON}$, respectively. Thus, each display area unit 12 is illuminated with a predetermined luminous intensity.

Figure 9A:
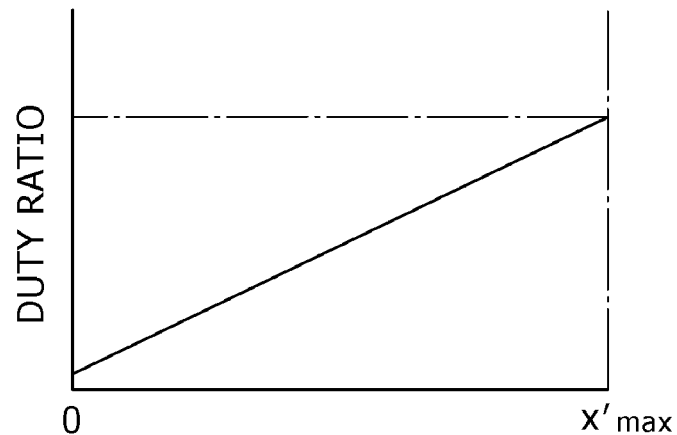
FIG. 9A is a diagram illustrating a relationship between a value obtained by raising an input signal inputted to an liquid crystal display apparatus driving circuit for driving a sub pixel to the 2.2th power and the duty ratio
Figure 9B:
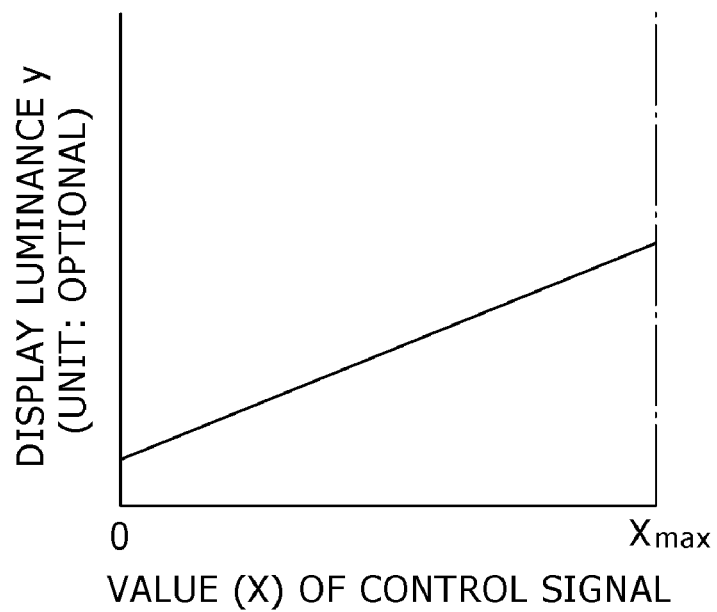
FIG. 9B is a diagram illustrating a relationship between the value of a control signal for controlling the light transmittance of a sub pixel and the display luminance of the sub pixel.

The state obtained in this manner is indicated by solid lines in FIGS. 9A and 9B. In particular, FIG. 9A illustrates a relationship between a value $(x' \equiv x^{2.2})$ obtained by raising the value of an input signal inputted to the liquid crystal display apparatus driving circuit 90 in order to drive a sub pixel to the 2.2th power and the duty ratio ($= t_{ON}/t_{Cout}$). FIG. 9B illustrates a relationship between the value X of a control signal for controlling the light transmittance Lt of a sub pixel and the display luminance y.

[Step-150]

Meanwhile, the values $X_R$, $X_G$, $X_B$ of the input signals [R, G, B] inputted to the liquid crystal display apparatus driving circuit 90 are sent to the timing controller 91. The timing controller 91 supplies (or outputs) control signals [R, G, B] corresponding to the input signals [R, G, B] inputted thereto to the sub pixels [R, G, B]. The values $X_R$, $X_G$, $X_B$ of the control signals [R, G, B] produced by the timing controller 91 of the liquid crystal display apparatus driving circuit 90 and supplied from the liquid crystal display apparatus driving circuit 90 to the sub pixels [R, G, B] and the values $x_R$, $x_G$, $x_B$ of the input signals [R, G, B] have relationships represented by the following expressions (4-1), (4-2) and (4-3), respectively:

$$X_R = f_R(b_{1\_R} \cdot x_R^{2.2} + b_{0\_R}) \quad (4\text{-}1)$$

$$X_G = f_G(b_{1\_G} \cdot x_G^{2.2} + b_{0\_G}) \quad (4\text{-}2)$$

$$X_B = f_B(b_{1\_B} \cdot x_B^{2.2} + b_{0\_B}) \quad (4\text{-}3)$$

where $b_{1\_R}$, $b_{0\_R}$, $b_{1\_G}$, $b_{0\_G}$, $b_{1\_B}$ and $b_{0\_B}$ are constants. Further, since the light source luminance $Y_2$ of the area light source unit 42 is varied for each image display frame, the control signals [R, G, B] basically have values obtained by performing correction (compensation) based on the variation of the light source luminance $Y_2$ for the values obtained by raising the values of the input signals [R, G, B] to the 2.2th power. In particular, in the Embodiment 1 and the Embodiment 2, since the value of the light source luminance $Y_2$ varies for each one image display frame, the values $X_R$, $X_G$, $X_B$ of the control signals [R, G, B] are determined and corrected (compensated for) so that the display luminance second prescribed value $y_2$ may be obtained at the light source luminance $Y_2$ ($\leq Y_1$) to control the light transmittance (numerical aperture) Lt of the pixel or sub pixel. Here, the functions $f_R$, $f_G$, $f_B$ of the expressions (4-1), (4-2) and (4-3) are functions determined in advance for performing such correction (compensation).

The image display operation for the one image display frame is completed therewith.

While the present invention has been described based on preferred embodiments thereof, the present invention is not limited to the embodiments. The configuration and structure of the color liquid crystal display apparatus of the transmission type, area light source apparatus, area light source units, liquid crystal display apparatus assemblies and driving circuits described hereinabove in connection with the embodiments is merely illustrative, and also the members, materials and so forth which are used to compose the configurations and structures are only illustrative and can be altered suitably. Further, while, in the embodiments described above, the light emitting element assembly 100 includes a lens 102 and a cap 130, where the cap 130 and the filler 140 function sufficiently as the lens 102 and there is no necessity to provide a lens 102 separately, the cap 130 and the filler 140 can be regarded as a lens and the lens above the cap 130 can be omitted.

Further, the temperature of each light emitting diode may be supervised by a temperature sensor such that a result of the supervision is fed back to an area light source unit driving circuit to perform luminance compensation (correction) or temperature control of an area light source unit. Further, while, in the embodiments described above, it is assumed that the display area of a liquid crystal display apparatus is divided in P×Q imaginary display area units, under certain circumstances, a liquid crystal display apparatus of the transmission type may have a structure wherein it is actually divided in P×Q display area units.

It should be understood by those skilled in the art that various modifications, combinations, sub-combinations and alterations may occur depending on design requirements and other factors insofar as they are within the scope of the appended claims or the equivalents thereof.

What is claimed is:

1. An area light source apparatus for illuminating a liquid crystal display apparatus of the transmission type, which has a display area formed from a plurality of pixels arrayed in a two-dimensional matrix, from the back, comprising:

a plurality of light emitting element assemblies each provided as a light source and each including a light emitting element and a lens through which light emitted from said light emitting element passes; and a plurality of dummy lenses disposed in the proximity of each of said light emitting element assemblies and configured same as the lenses of said light emitting element assemblies, wherein, in the proximity of any of said light emitting element assemblies, other ones of said light emitting element assemblies are disposed, one of said light emitting element assemblies is disposed in a region in which light emitted from the lens of another one of said light emitting element assemblies is introduced directly into the light emitting element assembly, a light emitting element assembly group is composed of a plurality of ones of said light emitting element assemblies which are positioned at the vertices of one or a plurality of imaginary squares, and a plurality of ones of said dummy lenses are disposed on the outer side of the light emitting element assembly group in such a manner as to be positioned at the vertices of imaginary squares of the same shape as that of the imaginary square.

\* \* \* \* \*